United States Patent
Takahashi et al.

(10) Patent No.: US 6,879,537 B2
(45) Date of Patent: Apr. 12, 2005

(54) SEMICONDUCTOR STORAGE DEVICE HAVING A PLURALITY OF OPERATION MODES

(75) Inventors: Hiroyuki Takahashi, Kanagawa (JP); Atsushi Nakagawa, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/492,765

(22) PCT Filed: Oct. 16, 2002

(86) PCT No.: PCT/JP02/10764
§ 371 (c)(1),
(2), (4) Date: Apr. 16, 2004

(87) PCT Pub. No.: WO03/038832
PCT Pub. Date: May 8, 2003

(65) Prior Publication Data
US 2005/0007851 A1  Jan. 13, 2005

(30) Foreign Application Priority Data
Oct. 16, 2001 (JP) .................................... 2001-318658

(51) Int. Cl.⁷ ................................................ G11C 7/00
(52) U.S. Cl. .................. 365/222; 365/233; 365/189.09; 365/236
(58) Field of Search ................................ 365/222, 233, 365/189.09, 236

(56) References Cited

U.S. PATENT DOCUMENTS

| | | | |
|---|---|---|---|
| 5,300,823 A | 4/1994 | Ihara | |
| 5,528,538 A | 6/1996 | Sakuta et al. | |
| 5,654,913 A | 8/1997 | Fukushima et al. | |
| 5,771,198 A | 6/1998 | Kang et al. | |
| 6,020,781 A | 2/2000 | Fujioka | |
| 6,288,963 B1 | 9/2001 | Kato | |
| 6,449,204 B1 * | 9/2002 | Arimoto et al. | 365/222 |
| 6,735,726 B2 * | 5/2004 | Muranaka et al. | 365/200 |
| 2002/0191472 A1 | 12/2002 | Okamoto et al. | |

FOREIGN PATENT DOCUMENTS

| | | |
|---|---|---|
| EP | 0 166 974 A2 | 1/1986 |
| EP | 0 242 948 A1 | 10/1987 |
| EP | 1 225 589 A2 | 7/2002 |
| JP | 61-5495 | 1/1986 |
| JP | 62-188096 | 8/1987 |
| JP | 63-206994 | 8/1988 |
| JP | 4-243087 | 8/1992 |
| JP | 6-36557 | 2/1994 |
| JP | 8-306185 | 11/1996 |
| JP | 2001-184865 | 7/2001 |
| JP | 2001-344971 | 12/2001 |
| JP | 2002-74944 | 3/2002 |
| JP | 2002-373490 | 12/2002 |

* cited by examiner

Primary Examiner—Michael S. Lebentritt
Assistant Examiner—Tuan T. Nguyen
(74) Attorney, Agent, or Firm—Choate, Hall & Stewart LLP

(57) ABSTRACT

An operation control circuit is provided for shortening a transition time from a deep stand-by mode to a stand-by mode in a pseudo-SRAM having the deep stand-by mode and the stand-by mode. The transition from the deep stand-by mode to the stand-by mode starts first and second timer circuits which respectively output a timer output TN of a constant cycle needed for self-refresh and a timing signal TR of a shorter cycle than a self-refresh cycle. A counter circuit counts the output TR from the second timer circuit immediately after the deep stand-by mode has been transitioned to the stand-by mode. If the counted value corresponds to a value as set, then the counter circuit outputs an operation mode switching signal. A selector circuit comprising a multiplexer is switched and controlled by the output from the counter circuit. The selector circuit remains selecting TR until the counted value of the counter circuit corresponds to the set value, and in the subsequent stand-by mode, the selector circuit selects and outputs TN.

18 Claims, 14 Drawing Sheets

SEMICONDUCTOR STORAGE DEVICE HAVING A PLURALITY OF OPERATION MODES

TECHNICAL FIELD

The present invention relates to a semiconductor memory device, and more particularly to an operation control circuit of a semiconductor memory device having a plurality of operation modes.

BACKGROUND ART

Typical examples of random access semiconductor memory devices are SRAM and DRAM. SRAM is faster in read and write operations than DRAM. SRAM is free of any refresh operations which are needed by DRAM. SRAM is thus more convenient in operations and smaller in data holding current in stand-by state. In contrast, each memory cell of SRAM needs six transistors. SRAM is larger in chip size and more expensive than DRAM.

Each memory cell of DRAM comprises a single capacitor and a single transistor. DRAM has a larger memory capacity at a smaller chip size than SRAM. DRAM is lower in cost than SRAM, provided that both have the same memory capacity. It is, however, necessary for DRAM that column and row addresses are given to DRAM separately from each other, provided that DRAM takes the column address at a timing defined by RAS (a row address strobe signal), and also takes the row address at another timing defined by CAS (a column address strobe signal). DRAM, therefore, needs RAS and CAS as well as needs a control circuit for cyclical refresh operations to memory cells. DRAM is more complicated in timing control and larger in comsumption of current than SRAM.

The majority of the semiconductor memory devices used in portable electronic devices typically portable telephones is SRAM for the following reasons. SRAM is smaller in stand-by current and lower in comsumption of power, for which reason SRAM is suitable for a portable telephone device which needs improvements in a long continuous communication time and in a long continuous stand-by time. Notwithstanding, the conventional portable telephone device had a simple function and does not need a semiconductor memory device with a large capacity. SRAM is easy in the timing control.

Meanwhile, the latest portable telephone device has an additional function of transmission and receipt of e-mails and a still additional function of both making an access to a WEB server on the Internet and subsequently displaying simplified contents of home pages. It is presumable that, similarly to the present personal computers, a future portable telephone device is capable of making a free access to home pages on the Internet. In order to realize such the above-described additional functions, a graphic display is essential for serving a variety of multimedia informations to user, and also a semiconductor memory device with a large capacity is needed for temporary storing, in the portable telephone device, a large amount of data received through public networks.

On the other hand, the portable telephone device needs a small size, a light weight and a low power consumption, for which reason the semiconductor memory device has an increased capacity, while it is desired to avoid increases in size, weight and power comsumption of the semiconductor memory device. As the semiconductor memory device integrated in the portable telephone device, DRAM is preferable in view of a large capacity, while SRAM is preferable in another view of operability and power comsumption. Such a semiconductor memory device as having both advantages of SRAM and DRAM seems optimum for the portable electronic devices.

As such the above-described semiconductor memory device, a "pseudo-SRAM" has been proposed, which uses the same memory cells as DRAM and have the same specifications and the same operations as SRAM in view of user side. The pseudo-SRAM is disclosed in Japanese laid-open patent publications Nos. 61-5495, 62-188096, 63-206994, 4-243087 and 6-36557.

Since the pseudo-SRAM has the same memory cell structure as DRAM, it is necessary for the pseudo-SRAM to perform cyclically refresh operations for holding data stored in memory cells thereof. The pseudo-SRAM is free of such a stand-by mode as of the conventional SRAM, even the pseudo-SRAM is similar in operations to the SRAM. It is preferable that the pseudo-SRAM has such a low power consumption mode as the general-purpose SRAM in view of operability as long as the pseudo-SRAM is operated in the same specification as the conventional SRAM.

The present inventions proposed, in view of the above-perspective, a semiconductor memory device which has a unique low power consumption mode different from the existent semiconductor memory device, and which has a stand-by mode equivalent to the stand-by mode of the general-purpose SRAM, with reference to the semiconductor device using the pseudo-SRAM, wherein the semiconductor memory device is disclosed in Japanese patent application No. 2000-363664 (Japanese laid-open patent publication No. 2002-74944 and International Publication No. WO01/41149A1. In accordance with this conventional invention, two different operation modes are set. The first operation mode is a stand-by mode as the same power supply mode as in the normal DRAM for supplying a power to circuits necessary for refresh of memory cells in order to ensure data hold of the memory cells. The second operation mode is a deep stand-by mode which discontinues any power supply to the circuits necessary for the refresh of the memory cells, thereby not ensuring the data hold of the memory cells.

In this deep stand-by mode, it is impossible to hold the data of the memory cells, but any refresh operation is unnecessary. This reduces the consumption of current in the deep stand-by mode as compared to the stand-by mode. This deep stand-by mode is available as long as all memory cells of the memory cell array become allowed for write operations during a transition from the stand-by state into the active state. This deep stand-by mode is suitable for using the semiconductor memory device as a buffer.

FIG. 1 is a block diagram illustrative of one example of the configuration of the essential part of the conventional pseudo SRAM. In FIG. 1, a voltage level control circuit 1 generates an internal voltage level control signal "A" based on first and second reference voltages Vref1 and Vref2. This internal voltage level control signal "A" is a signal for controlling a level of a boost voltage Vbt to be applied to word lines of a memory cell array 2. The internal voltage level control signal "A" is outputted from the voltage level control circuit 1 and then inputted into a ring oscillator 3. The ring oscillator 3 is activated and oscillated by "H" (high level) of the internal voltage level control signal "A" from the voltage level control circuit 1, whereby the ring oscillator 3 outputs an oscillation output "B". The oscillation output "B" outputted from the ring oscillator 3 is then inputted into a boost circuit 4.

The boost circuit 4 comprises a charge pump circuit for generating the boost voltage Vbt as an internal voltage. The boost circuit 4 boosts step-by-step a power voltage VDD by utilizing the oscillation output "B" outputted from the ring oscillator 3 for generating the boost voltage Vbt. This boost voltage Vbt is then inputted into a word decoder 5 for driving a word line. The boost voltage Vbt is set at a level which is higher than the power voltage VDD, for example, about VDD+1.5V to VDD+2V. The word decoder 5 supplies the boost voltage Vbt to a word line selected by an output from a row decoder 6. The memory cell array 2 comprises the same configuration as the memory cell array of DRAM.

A refresh timing generation circuit 7 generates a refresh signal and a refresh address, wherein the refresh signal is to refresh memory cells in the memory cell array 2 at a constant time interval, while the refresh address is to designate an address of a memory cell which should be refreshed. The refresh signal is outputted from the refresh timing generation circuit 7 and then inputted into a row enable generation circuit 8. The refresh address is outputted from the refresh timing generation circuit 7 and then inputted into the row decoder 6. The row enable generation circuit 8 generates a row enable signal LT at a timing when the refresh timing generation circuit 7 generates the refresh signal.

The row enable generating circuit 8 receives inputs of a write enable signal WE, a chip select signal CS and a read/write address Add of the memory cell array 2, and outputs the row enable signal LT every time the read/write address Add is transitioned. The row enable signal LT is inputted into the voltage level control circuit 1 and the row decoder 6.

FIG. 2 is a timing chart illustrative of an operation of the circuit shown in FIG. 1 in a stand-by mode. An operation of generating a boost voltage for refreshing memory cells will hereinafter be described with reference to FIGS. 1 and 2.

If the pseudo-SRAM is placed in the stand-by state, then the refresh signal is outputted from the refresh timing generation circuit 7 at a constant cycle, for example, 16 microseconds, and then the refresh signal is supplied to the row enable generation circuit 8. The row enable generation circuit 8 generates receives an input of the refresh signal and generates a row enable signal LT and then supplies the row enable signal LT to the voltage level control circuit 1. The voltage level control circuit 1 is activated by the row enable signal LT, whereby the voltage level control circuit 1 compares the boost voltage Vbt to the first and second reference voltages Vref1 and Vref2. If the boost voltage Vbt is lower than the first reference voltage Vref1, then the internal voltage level control signal "A" becomes "H" (high level), whereby the ring oscillator 3 starts an oscillation and supplies the oscillation output "B" to the boost circuit 4.

The boost circuit 4 boosts the boost voltage Vbt by using the oscillation output "B". After the boost voltage Vbt is boosted to reach the same level as the second reference voltage Vref2, then the voltage level control circuit 1 sets the internal voltage level control signal "A" at "L" (low level), whereby the oscillation of the ring oscillator 3 is discontinued, and thus the boosting operation of the boost circuit 4 is discontinued. During this cycle, the refresh operation is executed to the memory cells in the memory cell array 2.

In the stand-by mode, the refresh timing signal is automatically generated at a cycle which ensures holding data, together with placing the voltage level control circuit 1 into the power ON state, in order to hold the word level at not less than the reference voltage Vref1. Except when the refresh timing, the voltage level control circuit 1 is placed into the power OFF, in order to both ensure the data hold and reduce the consumption of current.

The pseudo SRAM is transitioned from the stand-by state into the active state, so that the chip select signal CS is risen and then the read/write address Add is then transitioned, whereby the row enable generation circuit 8 detects this transition and outputs the signal LT for activating the voltage level control circuit 1. Accordingly, in the active state, boosting operation of the boost voltage Vbt is made every time accesses to memory cells are made.

FIG. 3 is a block diagram illustrative of an example of a configuration of a conventional timing cycle generation circuit in the refresh timing generation circuit. The timing cycle generation circuit comprises an OR-gate 11 and a timer circuit 12, wherein the OR-gate 11 receives inputs of both an operation mode selecting signal MODE for switching between a deep stand-by mode and a stand-by mode and a chip select signal CS, and the timer circuit 12 receives an output from the OR-gate 11 and outputs a timer signal TN with a constant cycle for refresh operation when the output signal is "H" (high level). A self-refresh cycle of the memory cells in the stand-by mode is set by this timer signal TN.

FIG. 4 is a timing chart illustrative of an operation of the pseudo-SRAM shown in FIG. 1, which incorporates the timing cycle generation circuit shown in FIG. 3.

As shown in FIG. 4, in the deep stand-by mode, any power supply to the pseudo-SRAM shown in FIG. 1 is completely discontinued. Any power supply to the circuit necessary for refresh is also discontinued. Thus, the boost voltage Vbt of the boost circuit 4 is lowered almost to the ground potential. By switching the deep stand-by mode into the stand-by mode, the power supply to the pseudo-SRAM shown in FIG. 1 is re-started and thus the power supply to the circuit necessary for refresh is also made, whereby the refresh timing generation circuit 7 outputs refresh signals at a constant cycle, and the boost voltage Vbt of the boost circuit 4 is also increased.

The transition to the stand-by state is completed when the boost voltage Vbt is risen up to the first reference voltage Vref1, thereby enabling any active operations such as accesses to the memory. As shown in FIG. 4, however, it takes a time that the boost voltage Vbt lowered down to almost the ground potential in the deep stand-by mode is risen up to the first reference voltage Vref1 in the stand-by state.

Normally, a time of approximately 200 microseconds is set for boosting the voltage as the stand-by time until he pseudo-SRAM is started up and placed into an memory accessible state. During this time, any active operations are inhibited.

In the future, the necessary memory capacity will be further increased. In this case, a load to the boost circuit is also further increased, thereby making longer a time to rise up to the stand-by state. It is estimated that a voltage rising time of 200 micrometers is insufficient for rising up to the stand-by mode.

SUMMARY OF THE INVENTION

Accordingly, in view of the above issues, it is an object of the present invention to provide a semiconductor memory device having a first operation mode of completely discontinuing any power supplies to predetermined circuits, and a second operation mode of a power supply to the predetermined circuits, wherein the semiconductor memory device is capable of shortening a time necessary for transition from the first operation mode without the power supply into the second operation mode with the power supply.

It is a further object of the present invention to provide a timing cycle generation circuit provided in a semiconductor memory device having a first operation mode of completely discontinuing any power supplies to predetermined circuits, and a second operation mode of a power supply to the predetermined circuits, wherein the timing cycle generation circuit is capable of shortening a time necessary for transition from the first operation mode without the power supply into the second operation mode with the power supply.

It is a still further object of the present invention to provide a semiconductor memory device capable of performing a transition operation from a deep stand-by mode to a stand-by mode at a shortened transition time, along with a high speed operation of voltage boosting up to a refresh-enabling voltage level by using a shorter time cycle than a timer cycle, which is used for supplying cyclically a refresh voltage to a memory in the stand-by mode.

It is yet a further object of the present invention to provide a timing cycle generation circuit capable of performing a transition operation from a deep stand-by mode to a stand-by mode at a shortened transition time, along with a high speed operation of voltage boosting up to a refresh-enabling voltage level by using a shorter time cycle than a timer cycle, which is used for supplying cyclically a refresh voltage to a memory in the stand-by mode.

It is a furthermore object of the present invention to provide a semiconductor memory device capable of performing a transition operation from a power-off state to a stand-by mode of a power-on state at a shortened transition time, by using a shorter time cycle than a timer cycle, which is used in the stand-by mode.

It is moreover object of the present invention to provide a timing cycle generation circuit capable of performing a transition operation from a power-off state to a stand-by mode of a power-on state at a shortened transition time, by using a shorter time cycle than a timer cycle, which is used in the stand-by mode.

It is still more object of the present invention to provide a timing cycle generation circuit capable of selectively supplying a first timer cycle used in a first operation mode of allowing an internal circuit to perform a specific operation, and a second timer cycle being shorter than the first timer cycle, and the second timer cycle being selectively used only in transition operation to the first operation mode from other state than the first operation mode.

It is yet more object of the present invention to provide a timing cycle generation circuit capable of selectively supplying a first timer cycle used in a first operation mode of allowing an internal circuit to perform a specific operation, and a second timer cycle being shorter than the first timer cycle, and the second timer cycle being selectively used only in transition operation with voltage boost or drop to the first operation mode from other state than the first operation mode.

Accordingly, the present invention provides a semiconductor memory device having a plurality of operation modes, wherein the semiconductor memory device includes: a first cycle generation circuit for generating timing pulses of a first cycle; a second cycle generation circuit for generating timing pulses of a second cycle which is shorter than the first cycle; an internal voltage generation circuit for generating a predetermined internal voltage upon receiving inputs of the timing pulses from the first or second cycle generation circuit; and a timing pulse switching circuit for selecting the timing pulses from the second cycle generation circuit and supplying the selected timing pulses to the internal voltage generation circuit when the semiconductor memory device is transitioned from a first operation mode to a second operation mode in the plurality of operation modes.

The semiconductor memory device may further include a control circuit for outputting first, second and third control signals in accordance with an operation mode selecting signal which selects a single operation mode in the plurality of operation modes. The first and second cycle generation circuits are controlled in operation and non-operation independently in accordance with the first and second control signals, respectively, and the timing pulse switching circuit selects the timing pulses of either one of the first and second cycle generation circuits in accordance with the third control signal.

The control circuit may include a counter circuit for counting the timing pulses outputted from the second cycle generation circuit, and outputting the third control signal when a counted value becomes a previously set value.

The first operation mode may be an operation mode of discontinuing a power supply to a predetermined circuit of the semiconductor memory device, and the second operation mode may be an operation mode of supplying a power to the predetermined circuit.

The predetermined circuit may comprise a circuit necessary for refresh of memory cells of the semiconductor memory device.

The first cycle may be a cycle of refreshing memory cells of the semiconductor memory device.

The first operation mode may be an operation mode of not ensuring data hold stored in memory cells of the semiconductor memory device, and the second operation mode may be an operation mode of ensuring data hold stored in memory cells of the semiconductor memory device.

The internal voltage generation circuit may comprise a boost voltage generation circuit for generating a boost voltage to be applied to word lines of memory cells of the semiconductor memory device.

The internal voltage generation circuit may comprise an internal voltage down circuit for dropping an external power voltage and supplies the dropped power voltage to an internal circuit.

The internal voltage generation circuit may comprise a substrate back bias generation circuit for supplying a semiconductor substrate with a back bias voltage lower than a ground level.

The semiconductor memory device may comprise a pseudo-SRAM as one example.

The semiconductor memory device may, for example, be applicable to a portable electronic device.

The present invention further provides a semiconductor memory device having a plurality of memory cells, and having a stand-by mode of supplying a power to a circuit necessary for refreshing memory cells so as to ensure data hold stored in the memory cells, and a deep stand-by mode of discontinuing a power supply to the circuit necessary for refreshing memory cells so as not to ensure data hold stored in the memory cells, wherein the semiconductor memory device includes: an internal voltage generation circuit being so operated as synchronizing with a refresh cycle for generating a predetermined internal voltage; and a timing cycle generation circuit for controlling an operation cycle of the internal voltage generation circuit, and wherein the timing cycle generation circuit includes: a first timer circuit for setting so that the operation cycle of the internal voltage generation circuit synchronizes with the refresh cycle in the stand-by mode; and a second timer circuit operated in a transition from the deep stand-buy mode to the stand-by mode for setting so that the operation cycle of the internal voltage generation circuit is a cycle shorter than the refresh cycle, for making the internal voltage into a predetermined voltage level at a short time.

The timing cycle generation circuit further includes: an OR-gate receiving an input of an operation mode selecting signal for switching the deep stand-by mode and the stand-by mode and also another input of a chip select signal; the first timer circuit being operated, when the OR-gate receives an input of either the operation mode selecting signal or the chip select signal, so that the first timer circuit outputs a timer signal synchronizing with the refresh cycle; a logic circuit receiving both the operation mode selecting signal and an output from a one-shot pulse generation circuit, and the logic circuit outputting a first level signal when the operation mode selecting signal is transitioned from the deep stand-by mode into the stand-by mode, and the logic circuit outputting a second level signal upon receipt of the output from the one-shot pulse generation circuit; the second timer circuit being operated, when the logic circuit outputs the first level signal, so that the second timer circuit outputs a timer signal with a shorter cycle than the refresh cycle; a counter circuit being re-set by a rising edge, to the first level, of the output from the logic circuit for counting a timer signal outputted from the second timer circuit, and the counter circuit outputting a timer output switching signal when a counted value reaches a previously set value; a selecting circuit receiving the timer output switching signal from the counter circuit, and the selecting circuit selecting either one of the timer signals from the first and second timer circuits for outputting selected one as a timer signal; and the one-shot pulse generation circuit receiving the timer output switching signal from the counter circuit, and the one-shot pulse generation circuit supplying one-shot pulse to the logic circuit.

The timing cycle generation circuit may further include: an OR-gate receiving an input of an operation mode selecting signal for switching the deep stand-by mode and the stand-by mode and also another input of a chip select signal; the first timer circuit being operated, when the OR-gate receives an input of either the stand-by mode signal or the chip select signal, so that the first timer circuit outputs a timer signal synchronizing with the refresh cycle; a logic circuit receiving both the operation mode selecting signal and the chip select signal, and the logic circuit outputting a first logic level signal when the operation mode selecting signal is transitioned from the deep stand-by mode into the stand-by mode, and the logic circuit outputting a second logic level signal upon receipt of the chip select signal; the second timer circuit being operated, when the logic circuit outputs the first logic level signal, so that the second timer circuit outputs a timer signal with a shorter cycle than the refresh cycle; and a selecting circuit for selecting and outputting either one of the timer signals from the first and second timer circuits in accordance with an output level from the logic circuit.

The internal voltage generation circuit may comprise a boost voltage generation circuit for generating a boost voltage to be applied to word lines of memory cells of the semiconductor memory device.

The internal voltage generation circuit may comprise an internal voltage down circuit for dropping an external power voltage and supplies the dropped power voltage to an internal circuit.

The internal voltage generation circuit may comprise a substrate back bias generation circuit for supplying a semiconductor substrate with a back bias voltage lower than a ground level.

The semiconductor memory device may comprise a pseudo-SRAM as one example.

The semiconductor memory device may, for example, be applicable to a portable electronic device.

The present invention further provides a semiconductor memory device having a plurality of memory cells, and having a stand-by mode of supplying a power to a circuit necessary for refreshing memory cells so as to ensure data hold stored in the memory cells, wherein the semiconductor memory device includes: an internal voltage generation circuit being so operated as synchronizing with a refresh cycle for generating a predetermined internal voltage; and a timing cycle generation circuit for controlling an operation cycle of the internal voltage generation circuit, and wherein the timing cycle generation circuit further includes: a first timer circuit for setting so that the operation cycle of the internal voltage generation circuit synchronizes with the refresh cycle in the stand-by mode; and a second timer circuit operated in a transition from a power OFF state to a power ON state for setting so that the operation cycle of the internal voltage generation circuit is a cycle shorter than the refresh cycle, for making the internal voltage into a predetermined voltage level at a short time.

The timing cycle generation circuit may further include: an OR-gate receiving an input of a power ON signal and another input of a chip select signal; the first timer circuit being operated, when the OR-gate receives the power ON signal and the chip select signal, so that the first timer circuit outputs a timer signal synchronizing with the refresh cycle; a logic circuit receiving both the power ON signal and an output from a one-shot pulse generation circuit; the second timer circuit being operated, when the logic circuit outputs the first level signal, so that the second timer circuit outputs a timer signal with a shorter cycle than the refresh cycle; a counter circuit being re-set by a transition signal which represents that the output from the logic circuit is transitioned to the first logic level for counting a timer signal outputted from the second timer circuit, and the counter circuit outputting a timer output switching signal when a counted value reaches a previously set value; a selecting circuit receiving the timer output switching signal from the counter circuit, and the selecting circuit selecting either one of the timer signals from the first and second timer circuits for outputting selected one as a timer signal; and the one-shot pulse generation circuit receiving the timer output switching signal from the counter circuit, and the one-shot pulse generation circuit supplying one-shot pulse to the logic circuit.

The timing cycle generation circuit may further include: an OR-gate receiving an input of a power ON signal and another input of a chip select signal; the first timer circuit being operated, when the OR-gate receives the power ON signal and the chip select signal, so that the first timer circuit outputs a timer signal synchronizing with the refresh cycle; a logic circuit outputting a first logic level signal upon receipt of the power ON signal, and the logic circuit outputting a second logic level signal upon receipt of the chip select signal; the second timer circuit being operated, when the logic circuit outputs the first logic level signal, so that the second timer circuit outputs a timer signal with a shorter cycle than the refresh cycle; and a selecting circuit for selecting and outputting either one of the timer signals from the first and second timer circuits in accordance with an output level from the logic circuit.

The internal voltage generation circuit may comprise a boost voltage generation circuit for generating a boost voltage to be applied to word lines of memory cells of the semiconductor memory device.

The internal voltage generation circuit may comprise an internal voltage down circuit for dropping an external power voltage and supplies the dropped power voltage to an internal circuit.

The internal voltage generation circuit may comprise a substrate back bias generation circuit for supplying a semiconductor substrate with a back bias voltage lower than a ground level.

The semiconductor memory device may comprise a pseudo-SRAM as one example.

The semiconductor memory device may, for example, be applicable to a portable electronic device.

DETAILED DESCRIPTION OF VARIOUS EMBODIMENTS OF THE INVENTION

Embodiments of the present invention will, hereinafter, be described.

(First Embodiment)

Figure 5:
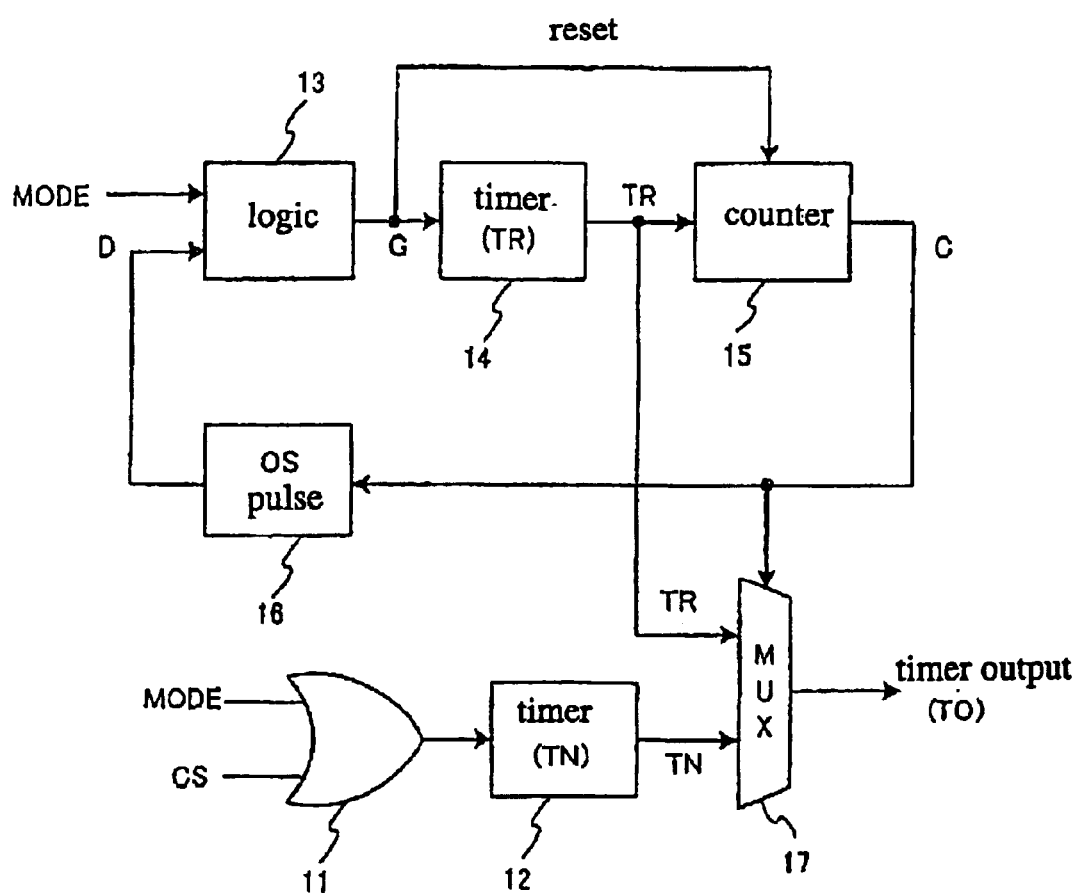
FIG. 5 is a block diagram illustrative of a configuration of a timing cycle generation circuit in accordance with the first embodiment of the present invention.

The first embodiment of the present invention provides a timing cycle generation circuit provided n a semiconductor memory device having a first stand-by mode of completely discontinuing any power supply to a predetermined circuit and a second stand-by mode of supplying a power to said predetermined circuit. FIG. 5 is a block diagram illustrative of a configuration of a timing cycle generation circuit in accordance with the first embodiment of the present invention.

The timing cycle generation circuit has the following circuit configuration. The timing cycle generation circuit includes an OR-gate 11, a first timer circuit 12, a logic circuit 13, a second timer circuit 14, a counter circuit 15, a one-shot pulse generation circuit 16 and a selector circuit 17.

The OR-gate 11 receives an input of an operation mode selecting signal MODE which switches a deep stand-by mode and a stand-by mode and another input of a chip select signal CS. The OR-gate 11 outputs a logical OR of the operation mode selecting signal MODE and the chip select signal CS. An output from the OR-gate 11 is then inputted into the first timer circuit 12. If the output from the OR-gate 11 is "H" (high level), then the first timer circuit 12 is operated to output a timer signal TN of a first cycle (16 microseconds).

The logic circuit 13 receives the operation mode selecting signal MODE and an output signal from the one-shot pulse generation circuit 16, so that the logic circuit 13 outputs a logic output G which is then inputted into the second timer circuit 14. If the logic output G from the logic circuit 13 is "H" (high level), then the second timer circuit 14 is operated to output another timer signal TR of a second cycle shorter than the first cycle. The timer signal TR of the second cycle from the second timer circuit 14 and the logic output G from the logic circuit 13 are inputted into the counter circuit 15. The counter circuit 15 is re-set by a transition of the logic output G from the logic circuit 13 to "H" (high level), so that the counter circuit 15 counts the timer signal TR from the second timer circuit 14. If the counted value reaches a previously set value, then the counter circuit 15 outputs a timer output switching signal C of "H" (high level). The timer output switching signal C outputted form the counter circuit 15 is then supplied to both the one-shot pulse generation circuit 16 and the selector circuit 17.

The selector circuit 17 may comprise a multiplexer (MUX). The selector circuit 17 receives the timer output switching signal C outputted form the counter circuit 15, so that based on the timer output switching signal C, the selector circuit 17 selects either one of the timer signal TN of the first cycle outputted from the first timer circuit 12 and the timer signal TR of the second cycle outputted from the second timer circuit 14, whereby the selector circuit 17 outputs the selected one as a timer output TO. The one-shot pulse generation circuit 16 receives the timer output switching signal C form the counter circuit 15, so that the one-shot pulse generation circuit 16 outputs one-shot pulse D. The one-shot pulse D is then inputted into the logic circuit 13, so that the logic circuit 13 receives both the operation mode selecting signal MODE and the logic circuit 13 and outputs the logic output G.

The second cycle of the timer signal TR outputted from the second timer circuit 14 is set shorter than the first cycle of the timer signal TN outputted from the first timer circuit 12. Thus, the timer signal TN of the first cycle outputted from the first timer circuit 12 is a timer signal to be used in the normal operation, while the timer signal TR of the second cycle outputted from the second timer circuit 14 is another timer signal to be used only in a time period of needing a high speed operation.

Accordingly, the above-described novel timing cycle generation circuit of the present invention has a novel circuit configuration of selectively supplying one of the timer signal TN of the first cycle and the timer signal TR of the second cycle shorter than the first cycle, wherein the timer signal TN is used in the first operation mode, in which the internal circuit performs a specific operation such as a refresh operation, and the timer signal TR is used selectively in a transition from other state than the first operation mode into the first operation mode, for example, in voltage-boosting operation or voltage-down operation. The internal circuit is capable of taking a specific operation mode of performing a specific operation, and other state than this specific operation mode, provided that any transition time is present from the other state than the specific operation mode into the specific operation mode. If it is necessary or desired to shorten the transition time, then the above-described novel timing cycle generation circuit of the present invention is applicable.

For example, in case that the above-described novel timing cycle generation circuit is applied to a pseudo-SRAM as one example of the internal circuit, the timer signal TN of the first cycle outputted from the first timer circuit 12 is used for cyclic refresh operations in the stand-by mode, while the timer signal TR of the second cycle outputted from the second timer circuit 14 is used but only in the transition time from the deep stand-by mode to the stand-by mode, or in the transition time from the power ON time into the stand-by mode, for high speed voltage adjustment to a voltage level enabling refresh operation, resulting in a shortened switching time from the deep stand-by mode or the power ON time into the stand-by mode.

Figure 1:
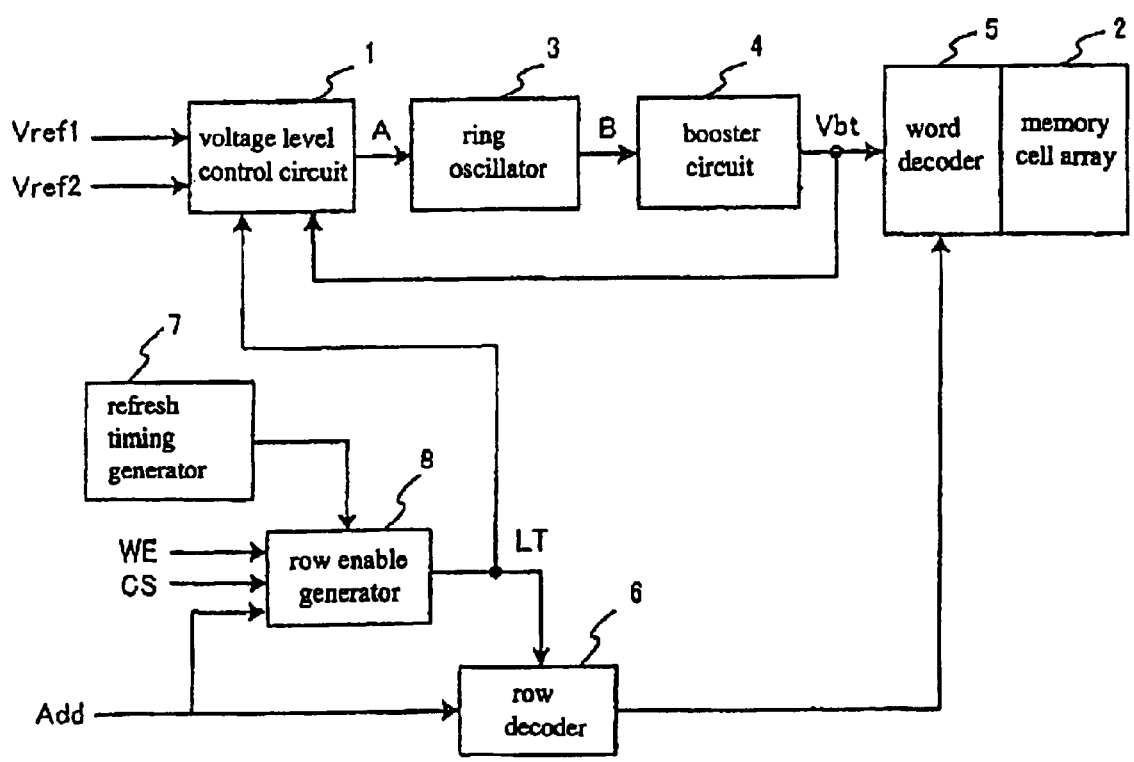
FIG. 1 is a block diagram illustrative of one example of the structure of the essential part of the conventional pseudo-SRAM.
Figure 2:
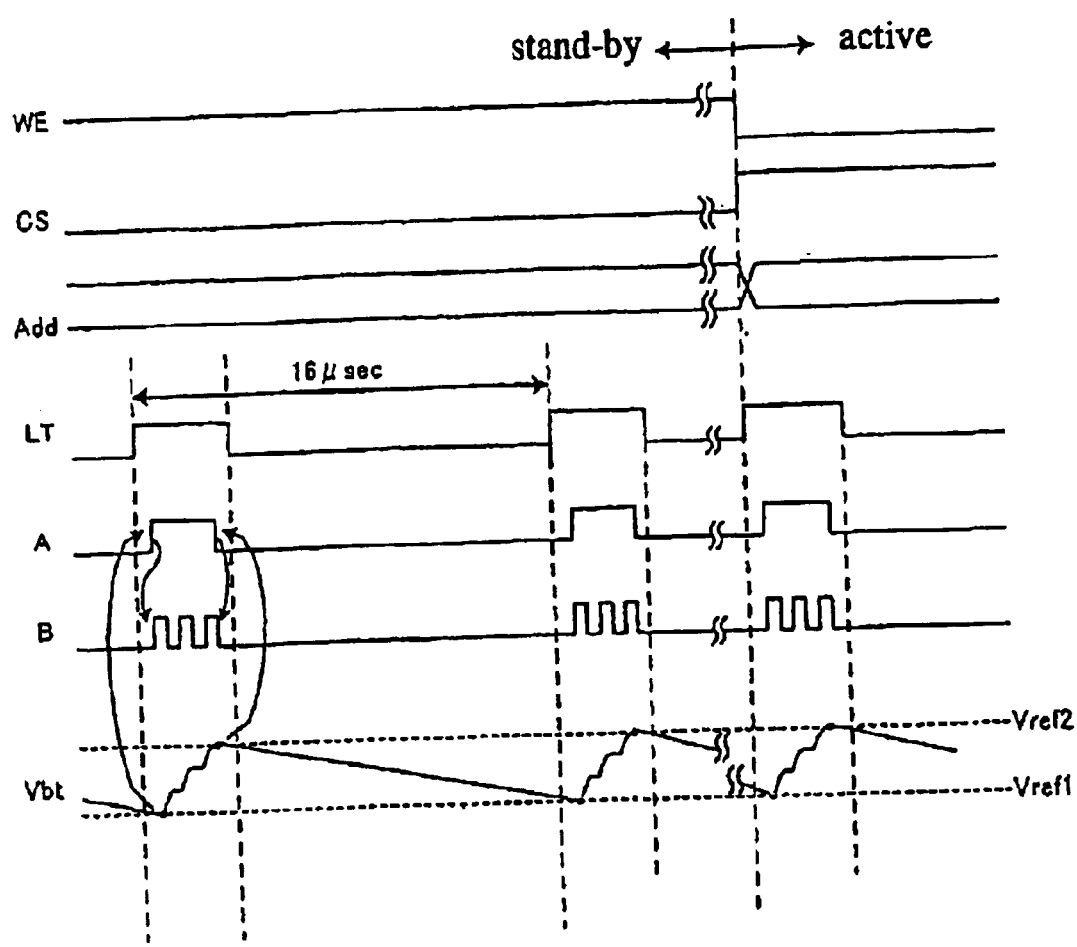
FIG. 2 is a timing chart describing operations in stand-by mode of the circuits shown in FIG. 1.
Figure 3:
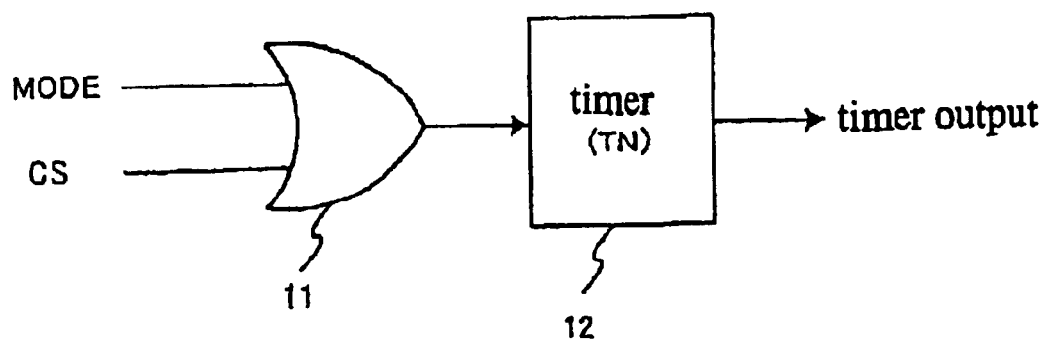
FIG. 3 is a block diagram illustrative of an example of a configuration of the conventional timing cycle generation circuit in the refresh timing generation circuit.
Figure 4:
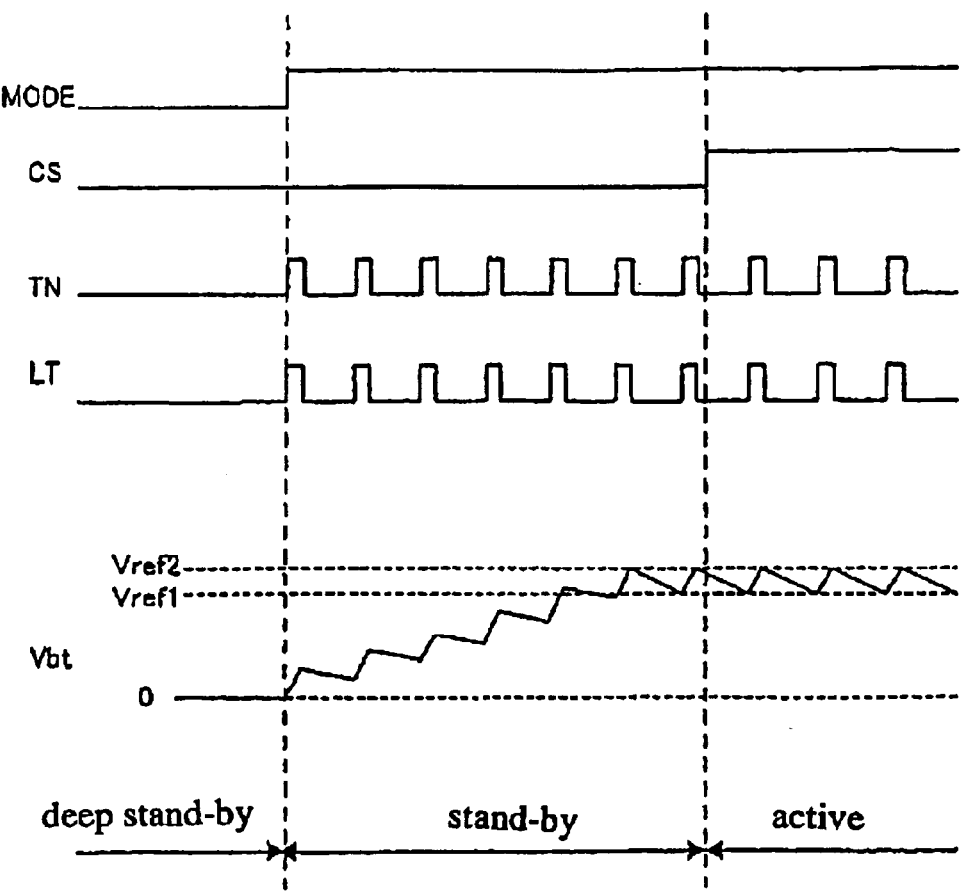
FIG. 4 is a timing chart illustrative of an operation of the pseudo-SRAM shown in FIG. 1, which incorporates the timing cycle generation circuit shown in FIG. 3.

There is no need to limit the circuit configuration of the pseudo-SRAM, to which the timing cycle generation circuit is applicable. For example, the timing cycle generation circuit is applicable to the pseudo-SRAM shown in FIG. 1. In order to demonstrate the usefulness of the novel timing cycle generation circuit in accordance with the present invention, the following descriptions will focus on one typical example that the timing cycle generation circuit is applied to the known pseudo-SRAM as the internal circuit.

Figure 6:
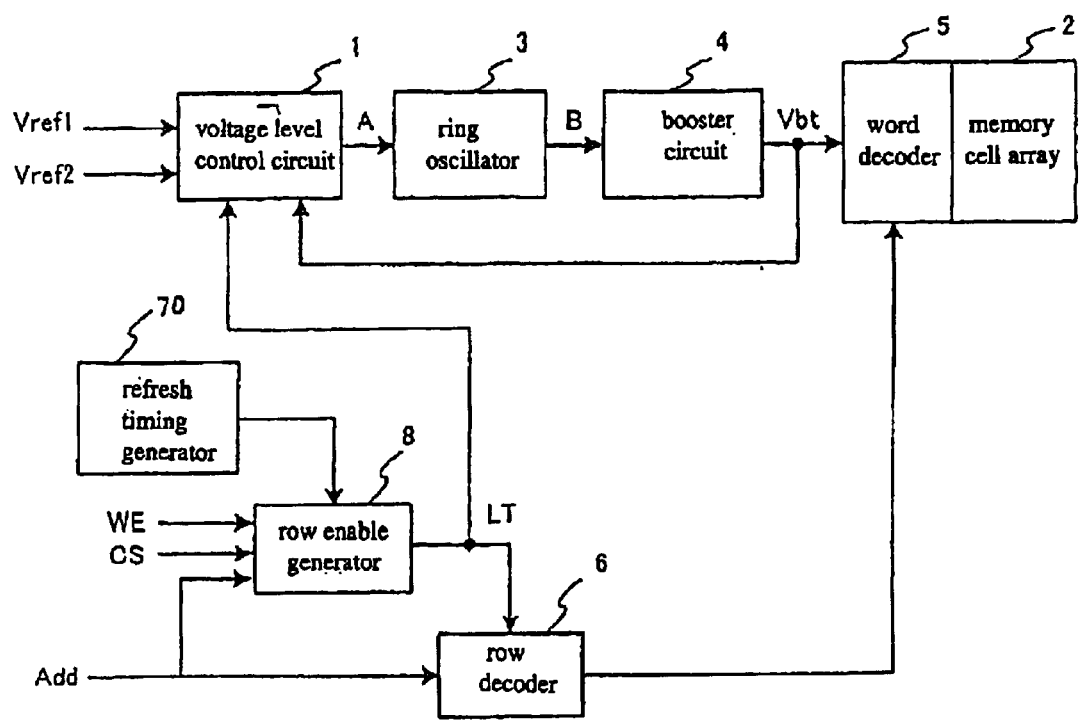
FIG. 6 is a block diagram illustrative of one example of a structure of an essential part of a known pseudo-SRAM, to which a timing cycle generation circuit is applicable in accordance with the first embodiment of the present invention.

FIG. 6 is a block diagram illustrative of one example of a structure of an essential part of the known pseudo-SRAM, to which the timing cycle generation circuit is applicable in accordance with the first embodiment of the present invention. The essential part of the pseudo-SRAM shown in FIG. 6 is almost identical in configuration to the essential part of the pseudo-SRAM shown in FIG. 1, except for a configuration of a refresh timing generation circuit 70.

In FIG. 6, a voltage level control circuit 1 generates an internal voltage level control signal "A" based on first and second reference voltages Vref1 and Vref2. This internal voltage level control signal "A" is a signal for controlling a level of a boost voltage Vbt to be applied to word lines of a memory cell array 2. The internal voltage level control signal "A" is outputted from the voltage level control circuit 1 and then inputted into a ring oscillator 3. The ring oscillator 3 is activated and oscillated by "H" (high level) of the internal voltage level control signal "A" from the voltage level control circuit 1, whereby the ring oscillator 3 outputs an oscillation output "B". The oscillation output "B" outputted from the ring oscillator 3 is then inputted into a boost circuit 4.

The boost circuit 4 comprises a charge pump circuit for generating the boost voltage Vbt as an internal voltage. The boost circuit 4 boosts step-by-step a power voltage VDD by utilizing the oscillation output "B" outputted from the ring oscillator 3 for generating the boost voltage Vbt. This boost voltage Vbt is then inputted into a word decoder 5 for driving a word line. The boost voltage Vbt is set at a level which is higher than the power voltage VDD, for example, about VDD+1.5V to VDD+2V. The word decoder 5 supplies the boost voltage Vbt to a word line selected by an output from a row decoder 6. The memory cell array 2 comprises the same configuration as the memory cell array of DRAM.

A refresh timing generation circuit 70 generates a refresh signal and a refresh address, wherein the refresh signal is to refresh memory cells in the memory cell array 2 at a constant time interval, while the refresh address is to designate an address of a memory cell which should be refreshed. The refresh timing generation circuit 70 includes the above-described timing cycle generation circuit shown in FIG. 5, wherein the timer output (TO) is inputted as a refresh signal into a row enable generation circuit 8. The refresh address is outputted from the refresh timing generation circuit 70 and then inputted into the row decoder 6. The row enable generation circuit 8 generates a row enable signal LT at a timing when the refresh timing generation circuit 70 generates the refresh signal.

The row enable generating circuit 8 receives inputs of a write enable signal WE, a chip select signal CS and a read/write address Add of the memory cell array 2, and the row enable generating circuit 8 outputs the row enable signal LT every time the read/write address Add is transitioned. The row enable signal LT is inputted into the voltage level control circuit 1 and the row decoder 6.

The above-described circuits of the pseudo-SRAM are operated based on the timer output TO outputted from the novel timing cycle generation circuit described with reference to FIG. 5.

Figure 7:
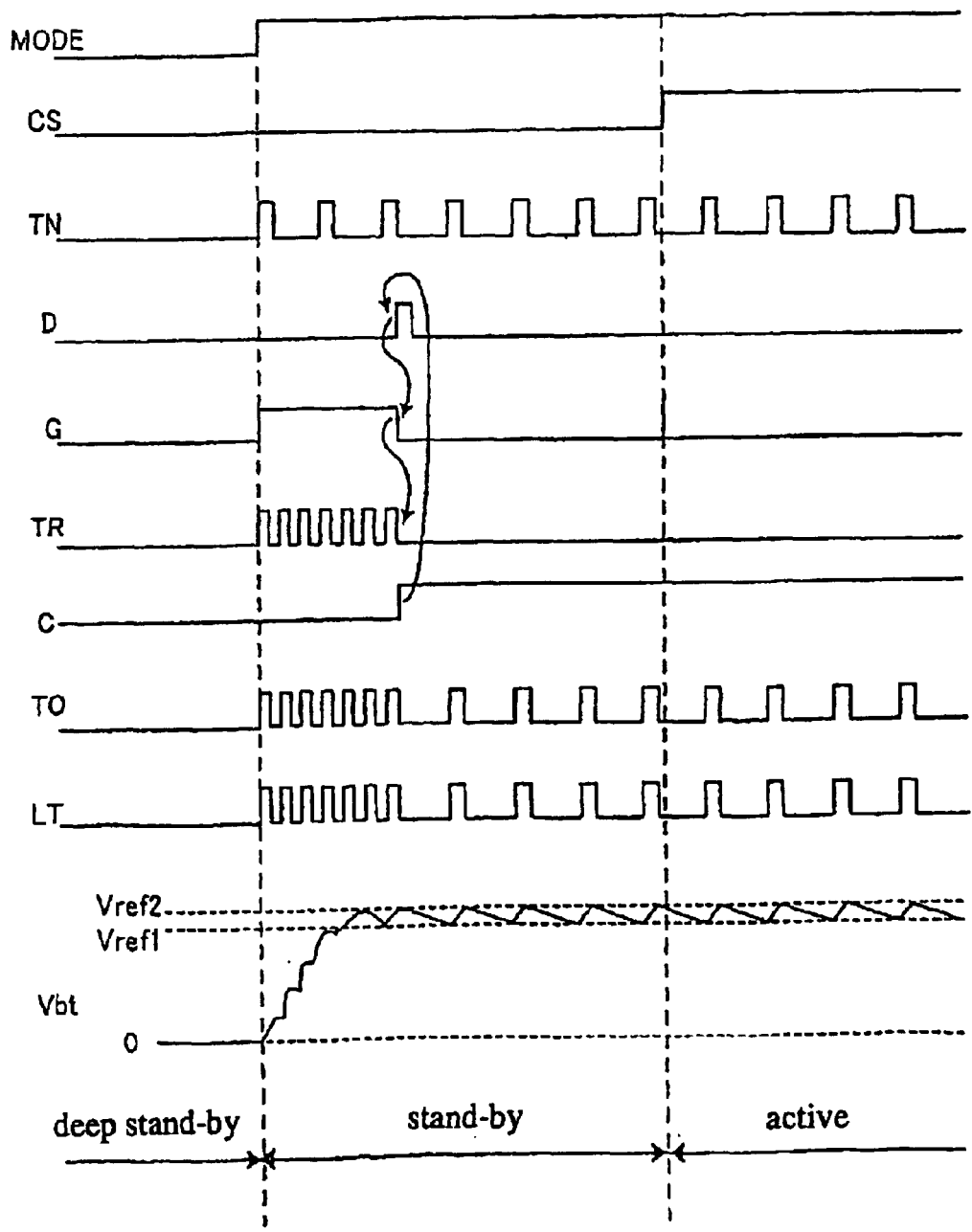
FIG. 7 is a timing chart illustrative of an operation of the pseudo-SRAM shown in FIG. 6, which incorporates the timing cycle generation circuit shown in FIG. 5 in accordance with the first embodiment.

FIG. 7 is a timing chart illustrative of an operation of the pseudo-SRAM shown in FIG. 6, which incorporates the timing cycle generation circuit shown in FIG. 5 in accordance with the first embodiment. Operations of the pseudo-SRAM will, hereinafter, be described with reference to FIGS. 5 through 7.

In the deep stand-by mode, a power supply is made to only the circuit which needs the power supply, while a power for the timing cycle generation circuit remains OFF-state, and the boost voltage Vbt is lowered at the ground potential. When this deep-stand-by mode is transitioned to the stand-by mode, then a power supply is made to the timing cycle generation circuit, whereby the operation mode selecting signal MODE becomes "H" (high level), and the logic output G from the logic circuit 13 becomes "H" (high level). The first and second timer circuits 12 and 14 are started, so that the timer signal TN of the first cycle is outputted from the first timer circuit 12, and the timer signal TR of the second cycle is outputted from the second timer circuit 14.

At the time when the operation mode selecting signal MODE becomes "H" (high level), the timer output switching signal C outputted from the counter circuit 15 is still "L" (low level). The logic output G from the logic circuit 13 is transitioned to "H" (high level), whereby the current count value of the counter circuit 15 is re-set, so that the counter circuit 15 counts the timer signal TR of the second cycle outputted from the second timer circuit 14. If the counted value of the counter circuit 15 becomes identical with the previously set value, then the timer output switching signal C outputted from the counter circuit 15 is transitioned to "H" (high level). The timer output switching signal C as a timer switching control signal from the counter circuit 15 is then inputted into the selector circuit 17.

If the timer output switching signal C from the counter circuit 15 is "H" (high level), the multiplexer of the selector circuit 17 selects and outputs the timer signal TR of the second cycle outputted from the second timer circuit 14. If the timer output switching signal C from the counter circuit 15 is "L" (low level), the multiplexer of the selector circuit 17 selects and outputs the timer signal TN of the first cycle outputted from the first timer circuit 12. Immediately after the deep stand-by mode is transitioned into the stand-by mode, then the timer signal TR of the second cycle from the second timer circuit 14 is selected by and outputted from the selector circuit 17, wherein the second timer circuit 14 is to output timing signals of shorter cycle than a self-refresh cycle. The boost circuit 4 shown in FIG. 6 executes a boost operation by the timer signal TR of the second cycle shorter than the refresh cycle, whereby the output voltage Vbt from the boost circuit 4 is returned at a high speed to a voltage level necessary for refreshing memory cells.

Thereafter, the counted value of the counter circuit 15 becomes a previously set value, and the timer output switching signal C outputted from the counter circuit 15 is transitioned to "H" (high level), so that the multiplexer of the selector circuit 17 selects and outputs the timer signal TN of the first cycle outputted from the first timer circuit 12. In the subsequent stand-by mode, the output voltage from the boost circuit 4 is maintained at the predetermined voltage by the timer signal TN of the first cycle of 16 microseconds which is needed for self-refresh operation, whereby the refresh operation is executed to the memory cells for ensuring data hold of the memory in the stand-by mode.

The timer output switching signal C outputted from the counter circuit 15 is also inputted into the one-shot pulse generation circuit 16. The one-shot pulse generation circuit 16 outputs the one-shot pulse D at a time when the timer output switching signal C is transitioned to "H" (high level). The one-shot pulse D is also inputted into the logic circuit 13, whereby the logic output G from the logic circuit 13 is transitioned to "L" (low level), whereby any current supply to the timer 14 is discontinued to suppress unnecessary consumption of current.

In accordance with this embodiment, the above descriptions have been made to the operations in transition from the deep stand-by mode to the stand-by mode. Notwithstanding, the timing cycle generation circuit of the present invention is applicable to the operation of boosting the boost voltage upon power ON to a device incorporating the pseudo-SRAM. In this case, the power-ON signal is used instead of the operation mode selecting signal MODE.

In accordance with the present embodiment, at the time either of the transition from the deep stand-by mode to the stand-by mode or of the power ON, the high speed voltage boosting operation up to such a voltage level as enabling refresh operation is executed by the timer cycle shorter than the timer cycle used for cyclically supplying the refresh voltage to the memory in the stand-by mode, thereby shortening the transition time from either the deep stand-by mode or the power-ON to the stand-by mode.

It is also possible to eliminate the second time circuit 14 operated at the transition from the deep stand-by mode to the stand-by mode or at the power-ON, while the timing cycle is controlled of the first timer circuit 12 used for cyclically supplying the refresh voltage to the memory in the stand-by mode, so that only the first timer circuit 12 generates the refresh cycle and the timing signal of the shorter cycle than this refresh cycle. In general, the timer generator comprises an analogue circuit which takes a time for changing the cycle. In order to realize a quick switch of the timing cycle, the use of the independent cycle generation means is effective in accordance with the present invention.

It is also possible to allow the transition to the stand-by mode within the above-described time as set if an increase in capacity of the memory of the device is needed, wherein the device has the stand-by mode ensuring the data hold of the memory cells and the deep stand-by mode of not ensuring the data hold of the memory cells, and the transition time has previously been set from either the deep stand-by mode or the power ON to the stand-by mode.

The above-described stand-by mode and deep stand-by mode are effective to suppress the consumption of power. For example, the semiconductor memory device having the above-described stand-by mode and deep stand-by mode is effectively applicable to portable electronic devices. Accordingly, the above-described timing cycle generation circuit is effectively applicable to semiconductor memory devices integrated in portable electronic devices.

(Second Embodiment)

The second embodiment of the present invention will, hereinafter, be described.

Figure 8:
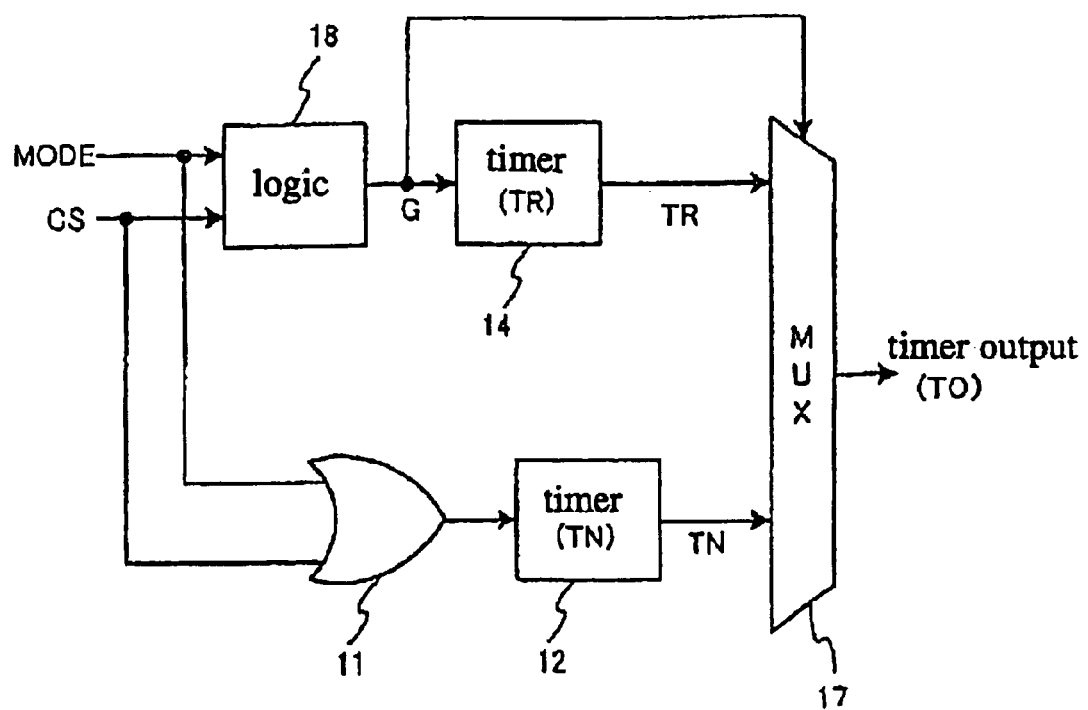
FIG. 8 is a block diagram illustrative of a configuration of a timing cycle generation circuit in accordance with the second embodiment of the present invention.

FIG. 8 is a block diagram illustrative of a timing cycle generation circuit in accordance with the second embodiment of the present invention.

The timing cycle generation circuit of the present invention comprises an OR-gate 11 which receives an input of an operation mode selecting signal MODE which switches a deep stand-by mode and a stand-by mode and another input of a chip select signal CS, a first timer circuit 12 which is operated upon "H" (high level) of the output from the OR-gate 11 for outputting a timer signal TN of a first cycle (16 microseconds), a logic circuit 18 which receives an input of the operation mode selecting signal MODE and another input of the chip select signal CS, a second timer circuit 14 which is operated upon "H" (high level) of the output from the logic circuit 18 for outputting a timer signal TR of a second cycle shorter than the first cycle, and a selector circuit 17 which selects either one signal from the first timer circuit 12 and the second timer circuit 14 based on the logic output G from the logic circuit 18 and outputs the selected one as the timer output TO. The selector circuit 17 may comprise a multiplexer (MUX).

Figure 9:
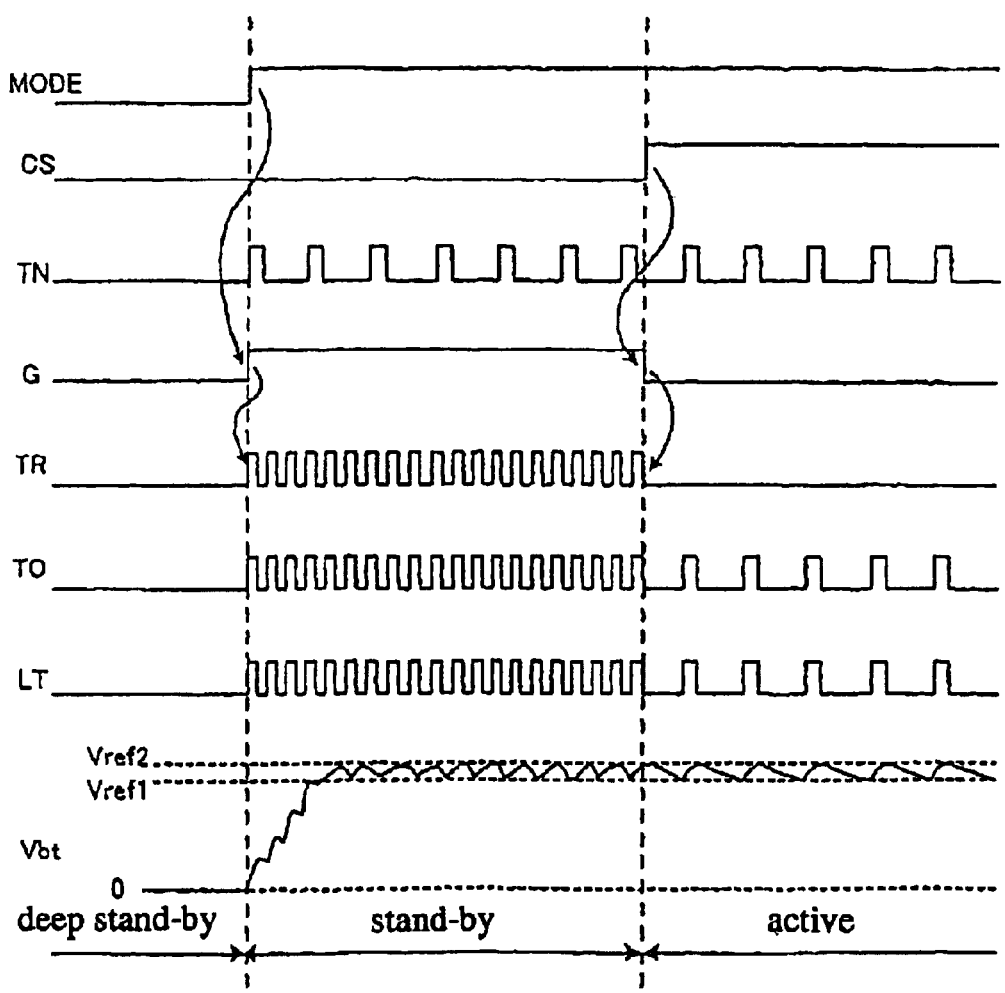
FIG. 9 is a timing chart illustrative of an operation of the pseudo-SRAM shown in FIG. 6, which incorporates the timing cycle generation circuit shown in FIG. 8 in accordance with the second embodiment.

FIG. 9 is a timing chart illustrative of an operation of the pseudo-SRAM shown in FIG. 6, which incorporates the timing cycle generation circuit shown in FIG. 8 in accordance with the second embodiment. Operations of the pseudo-SRAM will, hereinafter, be described with reference to FIGS. 6, 8 and 9.

In the deep stand-by mode, a power supply is made to only the circuit which needs the power supply, while a power for the timing cycle generation circuit remains OFF-state, and the boost voltage Vbt is lowered at the ground potential. When this deep-stand-by mode is transitioned to the stand-by mode, then a power supply is made to the timing cycle generation circuit, whereby the operation mode selecting signal MODE becomes "H" (high level), and the output from the OR-gate 11 and the logic output G from the logic circuit 13 become "H" (high level). The first and second timer circuits 12 and 14 are started, so that the timer signal TN of the first cycle is outputted from the first timer circuit 12, and the timer signal TR of the second cycle is outputted from the second timer circuit 14.

The logic output G from the logic circuit 18 is inputted into the multiplexer of the selector circuit 17 as the timer switching control signal. If the logic output G from the logic circuit 18 is "H" (high level), the multiplexer of the selector circuit 17 selects and outputs the timer signal TR of the second cycle outputted from the second timer circuit 14. If the logic output G from the logic circuit 18 is "L" (low level), the multiplexer of the selector circuit 17 selects and outputs the timer signal TN of the first cycle outputted from the first timer circuit 12.

Immediately after the deep stand-by mode is transitioned into the stand-by mode, then the timer signal TR of the second cycle from the second timer circuit 14 is selected and outputted. The boost circuit 4 shown in FIG. 6 executes a boost operation by the timer signal TR of the second cycle shorter than the refresh cycle, whereby the output voltage Vbt from the boost circuit 4 is returned at a high speed to a voltage level necessary for refreshing memory cells.

Thereafter, the chip select signal CS is transitioned to "H" (high level) for entry into the active mode, so that the multiplexer of the selector circuit 17 selects and outputs the timer signal TN of the first cycle outputted from the first timer circuit 12. The logic output G from the logic circuit 18 is transitioned from "L" (low level) to "H" (high level) only when the operation mode selecting signal MODE is transitioned from "L" (low level) to "H" (high level). If the chip select signal CS is thereafter transitioned to "L" (low level) for transition from the active mode to the stand-by mode, then the logic output G from the logic circuit 18 remains "L" (low level), whereby the second timer circuit 14 is not yet started.

In the subsequent switch between the stand-by mode and the active mode, the multiplexer of the selector circuit 17 selects and outputs the timer signal TN of the first cycle outputted from the first timer circuit 12. The boosting operation is executed by the boost circuit 4 based on the timer signal TN of the first cycle of 16 microseconds which is needed for self-refresh operation, whereby the output voltage from the boost circuit 4 is boosted up to the predetermined voltage and then maintained. Any self-refresh operation in the subsequent stand-by mode is normally executed for ensuring data hold of the memory.

In accordance with this embodiment, the above descriptions have been made to the operations in transition from the deep stand-by mode to the stand-by mode. Notwithstanding, the timing cycle generation circuit of the present invention is applicable to the operation of boosting the boost voltage upon power ON to a device incorporating the pseudo-SRAM. In this case, the power-ON signal is used instead of the operation mode selecting signal MODE.

In accordance with the present embodiment, the second timer circuit 14 continues its operation for continuously supplying the current until the first input of the chip select signal CS appears after the deep stand-by mode or the power ON state is transitioned to the stand-by mode. This continuous supply of the current causes a somewhat increase of the consumption of current as compared to the above first embodiment. Notwithstanding, it is possible to shorten the transition time from either the deep stand-by mode or the power-ON to the stand-by mode.

It is also possible to allow the transition to the stand-by mode within the above-described time as set if an increase in capacity of the memory of the device is needed, wherein the device has the stand-by mode ensuring the data hold of the memory cells and the deep stand-by mode of not ensuring the data hold of the memory cells, and the transition time has previously been set from either the deep stand-by mode or the power ON to the stand-by mode.

Figure 10:
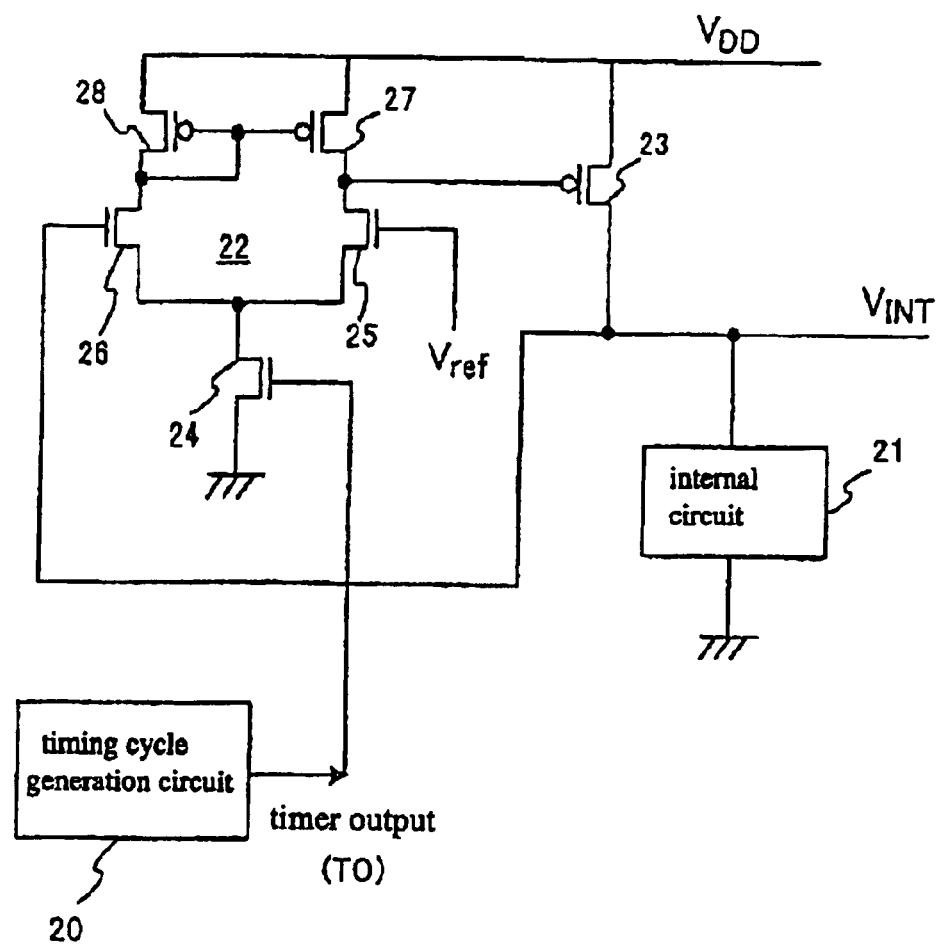
FIG. 10 is a circuit diagram of the timing cycle generation circuit applied to an internal voltage down circuit for reducing an external power voltage and supplies the reduced power voltage to an internal circuit, in accordance with one embodiment of the present invention.

FIG. 10 is a circuit diagram of the timing cycle generation circuit applied to an internal voltage down circuit for reducing an external power voltage and supplies the reduced power voltage to an internal circuit, in accordance with one embodiment of the present invention.

The internal voltage down circuit includes a differential amplifier 22 and a p-channel MOS field effect transistor 23 (hereinafter referred to as "PMOS transistor"). An inversion input terminal of the differential amplifier 22 receives an input of a reference voltage VREF, while a non-inversion input terminal of the differential amplifier 22 receives an input of an internal voltage VINT. A source electrode of the PMOS transistor is connected to an external power voltage VDD, while a gate electrode thereof receives an output signal from the differential amplifier 22, and a drain electrode thereof outputs an internal voltage VINT which is a voltage reduced from the external power voltage VDD. The internal voltage VINT, which is a voltage reduced from the external power voltage VDD, appears on an output line of the internal voltage down circuit. This output line of the internal voltage down circuit is connected to an internal circuit 21, so that the voltage-reduced internal voltage VINT is supplied to the internal circuit 21. The internal circuit 21 may include, but not limited to, semiconductor memory devices such as DRAM and pseudo-SRAM.

The differential amplifier 22 comprises an n-channel MOS field effect transistor 25 (hereinafter referred to as NMOS transistor) with a gate receiving an input of the reference voltage VREF, an NMOS transistor 26 with a gate receiving an input of the internal voltage VINT, a current source NMOS transistor 24 connected between a common source electrode of the NMOS transistors 25 and 26 and a ground potential, and a pair of PMOS transistors 26 and 27 constituting a current mirror, which are connected between respective drain electrodes of the NMOS transistors 25 and 26 and the external power voltage VDD. The drain electrode of the NMOS transistor 25 is connected to the gate electrode of the voltage-down PMOS transistor 23.

This differential amplifier 22 compares the internal voltage VINT on the output line to the reference voltage VREF. If the internal voltage VINT is lower than the reference voltage VREF, then the output voltage from the differential amplifier 22 or the drain voltage of the NMOS transistor 25 is dropped, whereby the PMOS transistor 23 is transitioned to ON-state, thereby increasing the current from the external power voltage VDD, and increasing the internal voltage VINT.

If the internal voltage VINT is higher than the reference voltage VREF, then the output voltage from the differential amplifier 22 is increased, whereby the PMOS transistor 23 is transitioned to OFF-state, thereby decreasing the current from the external power voltage VDD, and decreasing the internal voltage VINT. Namely, the differential amplifier 22 shows a negative feedback for controlling the internal voltage VINT to follow to the reference voltage VREF.

If the internal circuit 21 such as the DRAM or the pseudo-SRAM is in the inactive state free of any refresh or any access, then the internal circuit 21 consumes such a slight current as a leakage of current from the device. If an activating signal pulse is inputted into the internal circuit 21 and the internal circuit 21 is activated, then an internal current of the internal circuit 21 is increased, while the internal voltage VINT is decreased. The PMOS transistor 23 is transitioned to the ON-state by the above-described negative feedback function of the internal voltage down circuit, thereby increasing the current from the external power voltage VDD, whereby the internal voltage VINT is increased up to the reference voltage VREF.

A timing cycle generation circuit 20 has either one of the configurations shown in FIGS. 5 and 8. The timer output TO is inputted into the gate electrode of the current source NMOS transistor 24 in the differential amplifier 22. The differential amplifier 22 is controlled in operation and non-operation by the timer output TO outputted from the timing cycle generation circuit 20.

Figure 11:
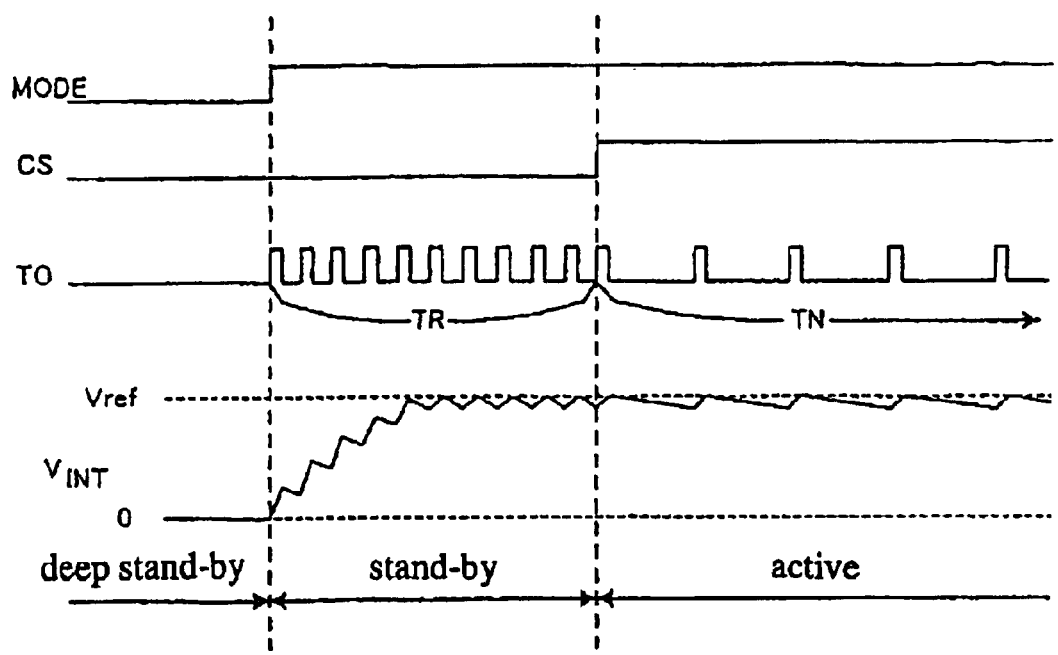
FIG. 11 is a timing chart illustrative of an operation of the timing cycle generation circuit shown in FIG. 8 applied to the internal voltage down circuit shown in FIG. 10 in accordance with the second embodiment.

FIG. 11 is a timing chart illustrative of an operation of the timing cycle generation circuit shown in FIG. 8 applied to the internal voltage down circuit shown in FIG. 10 in accordance with the second embodiment. Operations of the present embodiment will hereinafter be described with reference to FIGS. 10 and 11. FIG. 11 shows the operations in case that the circuit shown in FIG. 8 of the second embodiment is used for the timing cycle generation circuit 20. Notwithstanding, the circuit shown in FIG. 5 of the first embodiment is also applicable to perform the same operations. Operations of the timing cycle generation circuit 20 are identical with the operations shown in FIG. 7 or 9, for which reason the descriptions in details will be omitted.

In the deep stand-by mode, a power supply is made to only the circuit which needs the power supply, while a power for the timing cycle generation circuit 20 and the differential amplifier 22 remains OFF-state, so as not to ensure data hold in the memory cell in the internal circuit 21.

When this deep-stand-by mode is transitioned to the stand-by mode, then a power supply is made to the timing cycle generation circuit 20 and the differential amplifier 22, whereby the operation mode selecting signal MODE becomes "H" (high level). Immediately after the deep stand-by mode is transitioned into the stand-by mode, then the timer signal TR of the second cycle shorter than the self-refresh cycle is outputted from the second timer circuit and then the timer signal TR is selected and supplied to the gate electrode of the current source NMOS transistor 24 in the differential amplifier 22. The differential amplifier 22 performs a comparative operation of the internal voltage VINT to the reference voltage VREF every time the timer signal TR of the second cycle is inputted, whereby the internal voltage VINT is made closer to the reference voltage VREF at a high speed.

Thereafter, the chip select signal CS is transitioned to "H" (high level) for entry into the active mode from the stand-by mode, so that the timing cycle generation circuit 20 outputs the timer signal TN of the first cycle which needs the self-refresh. The differential amplifier 22 compares the internal voltage VINT to the reference voltage VREF to make the internal voltage VINT follow to the reference voltage VREF. Independent from the transition between the stand-by mode and the active mode, the timing cycle generation circuit 20 outputs the timer signal TN of the first cycle which needs the self-refresh to make the internal voltage VINT follow to the reference voltage VREF.

If the internal circuit 21 is inactivated in the stand-by mode, then the internal circuit 21 consumes such a slight current as a leakage of current and the internal voltage VINT has a small drop. The timing cycle generation circuit 20 of the present invention is applied to the voltage comparison operation of the differential amplifier 22, so that the differential amplifier 22 is inactivated at an interval between pulses of the timer signal TN of the first cycle synchronizing with the refresh and having been outputted from the first timer circuit 12. At the interval, the differential amplifier 22 is disconnected from the external power voltage VDD for reducing the consumption of current. In the transition from the deep stand-by mode to the stand-by mode, it is possible to improve the high speed performances of boosting the internal voltage and of transition to the stand-by mode.

In accordance with this embodiment, the above descriptions have been made to the operations in transition from the deep stand-by mode to the stand-by mode. Notwithstanding, the timing cycle generation circuit of the present invention is applicable to the operation of boosting the internal; voltage upon power ON to a device incorporating the internal circuit 21 such as the pseudo-SRAM. In this case, the power-ON signal is used instead of the operation mode selecting signal MODE.

Figure 12:
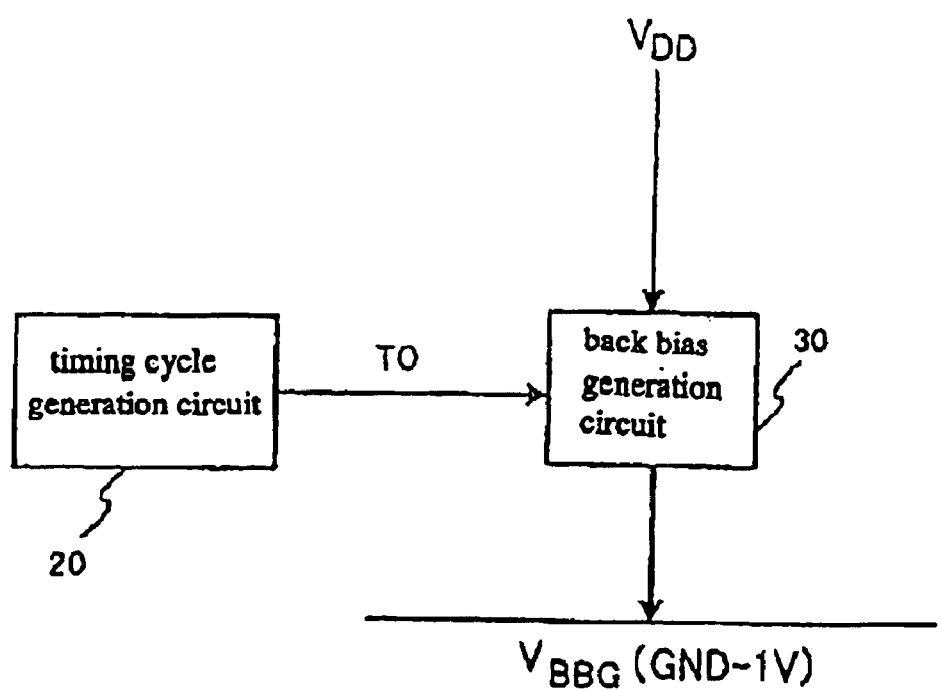
FIG. 12 is block diagram illustrative of an embodiment, wherein the timing cycle generation circuit according to the present invention is applied to a substrate back bias generation circuit for supplying a back bias lower than a ground level to a semiconductor substrate.

FIG. 12 is block diagram illustrative of an embodiment, wherein the timing cycle generation circuit according to the present invention is applied to a substrate back bias generation circuit for supplying a back bias lower than a ground level to a semiconductor substrate.

A substrate back bias generation circuit 30 uses the external power voltage VDD and the ground level and is operated by the timer output TO from the timing cycle generation circuit 20 for generating an internal reference voltage which comprises a back bias voltage VBBG which is lower than GND, for example, −1V. An output of the substrate back bias generation circuit 30 is connected to a region which needs application of the back bias voltage VBBG, for example, to a semiconductor substrate, so that the semiconductor substrate has the back bias voltage VBBG which is lower than ground level.

Figure 13:
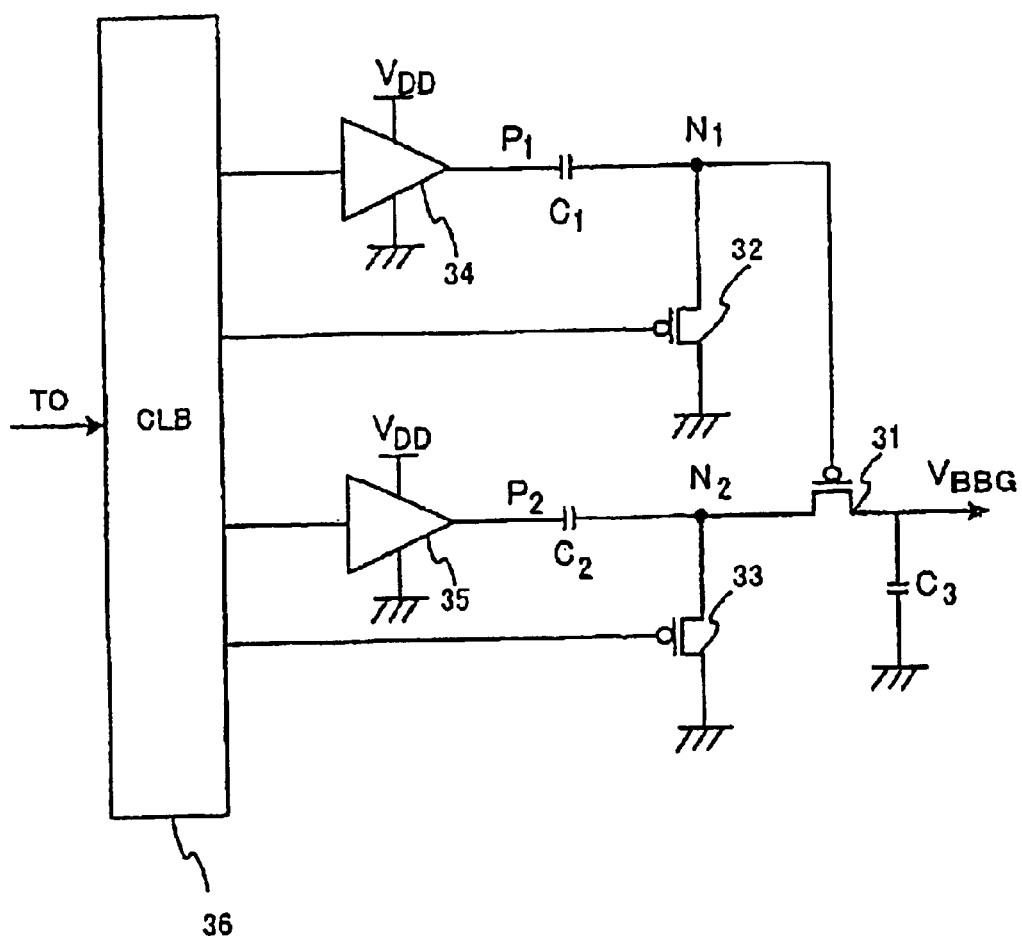
FIG. 13 is a circuit diagram illustrative of a typical example of the back bias generation circuit shown in FIG. 12.

FIG. 13 is a circuit diagram illustrative of a typical example of the back bias generation circuit shown in FIG. 12. As shown in FIG. 13, the above-described back bias generation circuit 30 comprises a transfer transistor 31 which comprises a PMOS transistor, two pre-charge transistors 32 and 33, a control logic block 36 receiving an input of the timing output TO from the above-described timing cycle generation circuit 20, a first output driver circuit 34 being controlled by the control logic block 36 for outputting, from its output terminal P1, either one of the external power voltage VDD and the ground level (GND), a second output driver circuit 35 being controlled by the control logic block 36 for outputting, from its output terminal P2, either one of a lower voltage VBB than the external power voltage VDD and the ground level (GND), a first capacitance C1 connected between the output terminal P1 of the first output driver circuit 34 and a first node N1 between a gate electrode of the transfer transistor 31 and a drain electrode of the pre-charge transistor 32, and a second capacitance C2 connected between the output terminal P2 of the second output driver circuit 35 and a second node N2 between a source electrode of the transfer transistor 31 and a drain electrode of the pre-charge transistor 33.

A capacitance C3 is a capacitance of the semiconductor substrate applied with the back bias voltage VBBG. The control logic block 36 receives an input of the timer output TO from the timing cycle generation circuit 20 and controls the pre-charge transistors 32 and 33 and the first and second output driver circuits 34 and 35.

Figure 14:
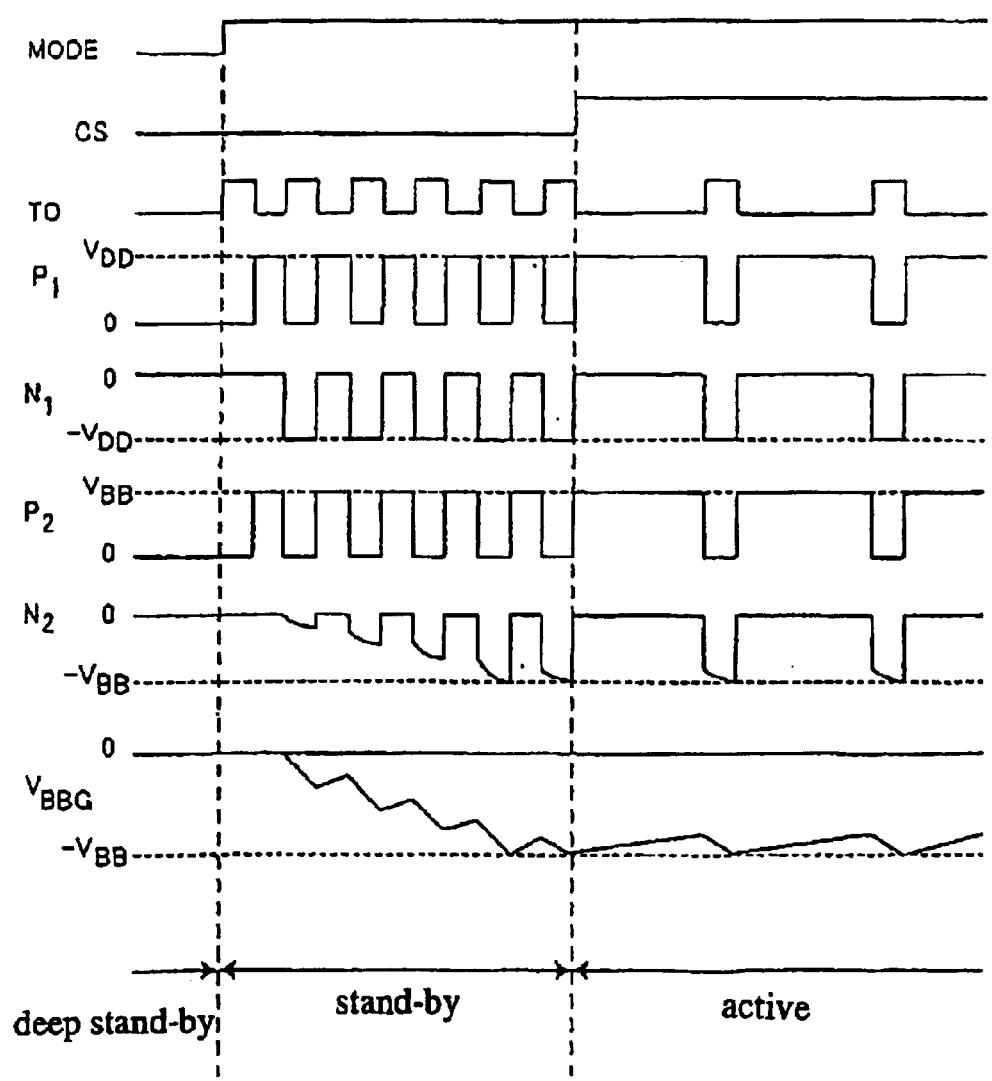
FIG. 14 is a timing chart showing a summary of operations of the back bias generation circuit shown in FIG. 13.

FIG. 14 is a timing chart showing a summary of operations of the back bias generation circuit shown in FIG. 13. Operations will be described with reference to FIGS. 13 and 14. FIG. 14 shows the operations in case that the circuit shown in FIG. 8 of the second embodiment is used for the timing cycle generation circuit 20. Notwithstanding, the circuit shown in FIG. 5 of the first embodiment is also applicable to perform the same operations. Operations of the timing cycle generation circuit 20 are identical with the operations shown in FIG. 7 or 9, for which reason the descriptions in details will be omitted.

In the deep stand-by mode, a power supply is made to only the circuit which needs the power supply, while a power for the timing cycle generation circuit 20 and the back bias generation circuit 30 remains OFF-state, and the back bias voltage VBBG is almost identical with the ground potential.

When this state is transitioned to the stand-by mode, then a power supply is made to the timing cycle generation circuit 20 and the back bias generation circuit 30, whereby the operation mode selecting signal MODE becomes "H" (high level). Immediately after the deep stand-by mode is transitioned into the stand-by mode, then the timer signal TR of the second cycle shorter than the self-refresh cycle is outputted from the second timer circuit 14 and then the timer signal TR is selected and supplied to the control logic block 36 of the back bias generation circuit 30. The control logic block 36 performs the following controls to the transfer transistor 31, the pre-charge transistors 32 and 33 and the first and second output driver circuits 34 and 35 every time the timer signal TR of the second cycle is inputted.

Respective output voltages appearing on the output terminals P1 and P2 of the first and second output driver circuits 34 and 35 become VDD and VBB (VDD>VBB) respectively, as well as the pre-charge transistors 32 and 33 turn ON to charge up the first and second capacitances C1 and C2 at VDD and VBB respectively. Respective output voltages appearing on the output terminals P1 and P2 of the first and second output driver circuits 34 and 35 become the ground potential, as well as the pre-charge transistors 32 and 33 turn OFF, whereby the first node N1 becomes −VDD and the second node N2 becomes −VBB by the first and second capacitances C1 and C2 charged up at the voltages VDD and VBB, respectively.

Since −VDD<−VBB, the transfer transistor 31 turns ON, the voltage of −VBB, at which the capacitance C2 has been charged up, is transferred through the transfer transistor 31 to the substrate capacitance C3. As a result, the substrate capacitance C3 is charged at a minus potential, whereby the back bias voltage VBBG is dropped to a minus potential. The above-described operations will be repeated every time the timing pulse TR from the timing cycle generation circuit 20 is inputted, thereby making the back bias voltage VBBG follow to the constant voltage of −VBB at a high speed.

Thereafter, the chip select signal CS is transitioned to "H" (high level) for entry into the active mode from the stand-by mode, so that the timing cycle generation circuit 20 outputs the timer signal TN of the first cycle which needs the self-refresh, and supplies the timer signal TN to the back bias generation circuit 30. In the back bias generation circuit 30, the voltage of −VBB, at which the capacitance C2 has been charged up, is transferred through the transfer transistor 31 to the substrate capacitance C3 every time the timing pulse TR is inputted, thereby maintaining the back bias voltage VBBG at the constant voltage of −VBB.

Independent from the transition between the stand-by mode and the active mode, the timing cycle generation circuit 20 outputs the timer signal TN of the first cycle which needs the self-refresh for maintaining the back bias voltage VBBG at the constant voltage of −VBB.

In accordance with the present embodiment, the substrate capacitance C3 is charged up at −VBB every interval between pulses of the timer signal TN of the first cycle from the first timer circuit 12, wherein the timer signal TN synchronizes with the refresh in the timing cycle generation circuit 20 for reducing the consumption of current. In the transition from the deep stand-by mode to the stand-by mode, it is possible to improve the high speed performances of boosting the back bias voltage and of transition to the stand-by mode.

In accordance with this embodiment, the above descriptions have been made to the operations in transition from the deep stand-by mode to the stand-by mode. Notwithstanding, the timing cycle generation circuit of the present invention is applicable to the operation of rising the back bias voltage upon power ON to a device incorporating the pseudo-SRAM. In this case, the power-ON signal is used instead of the operation mode selecting signal MODE.

In each of the foregoing embodiments, the above descriptions have been made to the operations in case that the deep stand-by mode and the stand-by mode are set as the operation modes of the semiconductor memory device. Notwithstanding, the present invention is effectively applicable, in case that the deep stand-by mode not ensuring the data hold of the memory cells is further sub-divided to an operation mode of discontinuing a power supply but only to the refresh control circuit needed for the refresh and another operation mode of discontinuing any power supplies to the refresh control circuit, the boost voltage generation circuit and the substrate voltage generation circuit, wherein the invention is applied to the voltage boosting operation in a transition between the sub-divided operation modes.

The above-described stand-by mode and deep stand-by mode are effective to suppress the consumption of power. For example, the semiconductor memory device having the above-described stand-by mode and deep stand-by mode is effectively applicable to portable electronic devices. Accordingly, the above-described timing cycle generation circuit is effectively applicable to semiconductor memory devices integrated in portable electronic devices.

INDUSTRIAL APPLICABILITY

The present invention provides the following effects.

In accordance with the present embodiment, at the time either of the transition from the deep stand-by mode to the stand-by mode or of the power ON, the high speed voltage boosting operation up to such a voltage level as enabling refresh operation is executed by the timer cycle shorter than the timer cycle used for cyclically supplying the refresh voltage to the memory in the stand-by mode, thereby shortening the transition time from either the deep stand-by mode or the power-ON to the stand-by mode.

It is also possible to allow the transition to the stand-by mode within the above-described time as set if an increase in capacity of the memory of the device is needed, wherein the device has the stand-by mode ensuring the data hold of the memory cells and the deep stand-by mode of not ensuring the data hold of the memory cells, and the transition time has previously been set from either the deep stand-by mode or the power ON to the stand-by mode.

The above-described stand-by mode and deep stand-by mode are effective to suppress the consumption of power. For example, the semiconductor memory device having the above-described stand-by mode and deep stand-by mode is effectively applicable to portable electronic devices. Accordingly, the above-described timing cycle generation circuit is effectively applicable to semiconductor memory devices integrated in portable electronic devices.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A semiconductor memory device having a plurality of operation modes, including:
- a first cycle generation circuit for generating timing pulses of a first cycle;
- a second cycle generation circuit for generating timing pulses of a second cycle which is shorter than said first cycle;
- an internal voltage generation circuit for generating a predetermined internal voltage upon receiving inputs of said timing pulses from said first or second cycle generation circuit;
- a timing pulse switching circuit for selecting said timing pulses from said second cycle generation circuit and supplying said selected timing pulses to said internal voltage generation circuit when said semiconductor memory device is transitioned from a first operation mode to a second operation mode in said plurality of operation modes; and
- a control circuit for outputting first, second and third control signals in accordance with an operation mode selecting signal which selects a single operation mode in said plurality of operation modes.
- wherein said first and second cycle generation circuits are controlled in operation and non-operation independently in accordance with said first and second control signals, respectively,
- wherein said timing pulse switching circuit selects said timing pulses of either one of said first and second cycle generation circuits in accordance with said third control signal, and
- wherein said control circuit includes a counter circuit for counting said timing pulses outputted from said second cycle generation circuit, and outputting said third control signal when a counted value becomes a previously set value.

2. A semiconductor device having a plurality of operation modes, including:
- a first cycle generation circuit for generating timing pulses of a first cycle;
- a second cycle generation circuit for generating timing pulses of a second cycle which is shorter than said first cycle;
- an internal voltage generation circuit for generating a predetermined internal voltage upon receiving inputs of said timing pulses from said first or second cycle generation circuit; and
- a timing pulse switching circuit for selecting said timing pulses from said second cycle generation circuit and supplying said selected timing pulses to said internal voltage generation circuit when said semiconductor memory device is transitioned from a first operation mode to a second operation mode in said plurality of operation modes,
- wherein said first operation mode is an operation mode of discontinuing a power supply to a predetermined circuit of said semiconductor memory device, and said second operation mode is an operation mode of supplying a power to said predetermined circuit, and
- wherein said predetermined circuit comprises a circuit necessary for refresh of memory cells of said semiconductor memory device.

3. A semiconductor memory device having a plurality of memory cells, and having a stand-by mode of supplying a power to a circuit necessary for refreshing memory cells so as to ensure data hold stored in said memory cells, and a deep stand-by mode of discontinuing a power supply to said circuit necessary for refreshing memory cells so as not to ensure data hold stored in said memory cells, wherein said semiconductor memory device includes:
- an internal voltage generation circuit being so operated as synchronizing with a refresh cycle for generating a predetermined internal voltage; and
- a timing cycle generation circuit for controlling an operation cycle of said internal voltage generation circuit, and
- wherein said timing cycle generation circuit includes:
  - a first timer circuit for setting so that said operation cycle of said internal voltage generation circuit synchronizes with said refresh cycle in said stand-by mode; and
  - a second timer circuit operated in a transition from said deep stand-buy mode to said stand-by mode for setting so that said operation cycle of said internal voltage generation circuit is a cycle shorter than said refresh cycle, for making said internal voltage into a predetermined voltage level at a short time.

4. The semiconductor memory device as claimed in claim 3, wherein said timing cycle generation circuit further includes:
- an OR-gate receiving an input of an operation mode selecting signal for switching said deep stand-by mode and said stand-by mode and also another input of a chip select signal;
- said first timer circuit being operated, when said OR-gate receives an input of either said operation mode selecting signal or said chip select signal, so that said first timer circuit outputs a timer signal synchronizing with said refresh cycle;
- a logic circuit receiving both said operation mode selecting signal and an output from a one-shot pulse generation circuit, and said logic circuit outputting a first level signal when said operation mode selecting signal is transitioned from said deep stand-by mode into said stand-by mode, and said logic circuit outputting a second level signal upon receipt of said output from said one-shot pulse generation circuit;
- said second timer circuit being operated, when said logic circuit outputs said first level signal, so that said second timer circuit outputs a timer signal with a shorter cycle than said refresh cycle;
- a counter circuit being re-set by a rising edge, to said first level, of said output from said logic circuit for counting a timer signal outputted from said second timer circuit, and said counter circuit outputting a timer output switching signal when a counted value reaches a previously set value;
- a selecting circuit receiving said timer output switching signal from said counter circuit, and said selecting circuit selecting either one of said timer signals from said first and second timer circuits for outputting selected one as a timer signal; and
- said one-shot pulse generation circuit receiving said timer output switching signal from said counter circuit, and said one-shot pulse generation circuit supplying one-shot pulse to said logic circuit.

5. The semiconductor memory device as claimed in claim 3, wherein said timing cycle generation circuit further includes:
- an OR-gate receiving an input of an operation mode selecting signal for switching said deep stand-by mode and said stand-by mode and also another input of a chip select signal;

said first timer circuit being operated, when said OR-gate receives an input of either said stand-by mode signal or said chip select signal, so that said first timer circuit outputs a timer signal synchronizing with said refresh cycle;

a logic circuit receiving both said operation mode selecting signal and said chip select signal, and said logic circuit outputting a first logic level signal when said operation mode selecting signal is transitioned from said deep stand-by mode into said stand-by mode, and said logic circuit outputting a second logic level signal upon receipt of said chip select signal;

said second timer circuit being operated, when said logic circuit outputs said first logic level signal, so that said second timer circuit outputs a timer signal with a shorter cycle than said refresh cycle; and a selecting circuit for selecting and outputting either one of said timer signals from said first and second timer circuits in accordance with an output level from said logic circuit.

6. The semiconductor memory device as claimed in claim 3, wherein said internal voltage generation circuit comprises a boost voltage generation circuit for generating a boost voltage to be applied to word lines of memory cells of said semiconductor memory device.

7. The semiconductor memory device as claimed in claim 3, wherein said internal voltage generation circuit comprises an internal voltage down circuit for dropping an external power voltage and supplies the dropped power voltage to an internal circuit.

8. The semiconductor memory device as claimed in claim 3, wherein said internal voltage generation circuit comprises a substrate back bias generation circuit for supplying a semiconductor substrate with a back bias voltage lower than a ground level.

9. The semiconductor memory device as claimed in claim 3, wherein said semiconductor memory device comprises a pseudo-SRAM.

10. A portable electronic device provided with a semiconductor memory device as claimed in claim 3.

11. A semiconductor memory device having a plurality of memory cells, and having a stand-by mode of supplying a power to a circuit necessary for refreshing memory cells so as to ensure data hold stored in said memory cells, wherein said semiconductor memory device includes:

an internal voltage generation circuit being so operated as synchronizing with a refresh cycle for generating a predetermined internal voltage; and a timing cycle generation circuit for controlling an operation cycle of said internal voltage generation circuit, and wherein said timing cycle generation circuit further includes:

a first timer circuit for setting so that said operation cycle of said internal voltage generation circuit synchronizes with said refresh cycle in said stand-by mode; and a second timer circuit operated in a transition from a power OFF state to a power ON state for setting so that said operation cycle of said internal voltage generation circuit is a cycle shorter than said refresh cycle, for making said internal voltage into a predetermined voltage level at a short time.

12. The semiconductor memory device as claimed in claim 11, wherein said timing cycle generation circuit further includes;

an OR-gate receiving an input of a power ON signal and another input of a chip select signal;

said first timer circuit being operated, when said OR-gate receives said power ON signal and said chip select signal, so that said first timer circuit outputs a timer signal synchronizing with said refresh cycle;

a logic circuit receiving both said power ON signal and an output from a one-shot pulse generation circuit;

said second timer circuit being operated, when said logic circuit outputs said first level signal, so that said second timer circuit outputs a timer signal with a shorter cycle than said refresh cycle;

a counter circuit being re-set by a transition signal which represents that said output from said logic circuit is transitioned to said first logic level for counting a timer signal outputted from said second timer circuit, and said counter circuit outputting a timer output switching signal when a counted value reaches a previously set value;

a selecting circuit receiving said timer output switching signal from said counter circuit, and said selecting circuit selecting either one of said timer signals from said first and second timer circuits for outputting selected one as a timer signal; and said one-shot pulse generation circuit receiving said timer output switching signal from said counter circuit, and said one-shot pulse generation circuit supplying one-shot pulse to said logic circuit.

13. The semiconductor memory device as claimed in claim 11, wherein said timing cycle generation circuit further includes:

an OR-gate receiving an input of a power ON signal and another input of a chip select signal;

said first timer circuit being operated, when said OR-gate receives said power ON signal and said chip select signal, so that said first timer circuit outputs a timer signal synchronizing with said refresh cycle;

a logic circuit outputting a first logic level signal upon receipt of said power ON signal, and said logic circuit outputting a second logic level signal upon receipt of said chip select signal;

said second timer circuit being operated, when said logic circuit outputs said first logic level signal, so that said second timer circuit outputs a timer signal with a shorter cycle than said refresh cycle; and a selecting circuit for selecting and outputting either one of said timer signals from said first and second timer circuits in accordance with an output level from said logic circuit.

14. The semiconductor memory device as claimed in claim 11, wherein said internal voltage generation circuit comprises a boost voltage generation circuit for generating a boost voltage to be applied to word lines of memory cells of said semiconductor memory device.

15. The semiconductor memory device as claimed in claim 11, wherein said internal voltage generation circuit comprises an internal voltage down circuit for dropping an external power voltage and supplies the dropped power voltage to an internal circuit.

16. The semiconductor memory device as claimed in claim 11, wherein said internal voltage generation circuit comprises a substrate back bias generation circuit for supplying a semiconductor substrate with a back bias voltage lower than a ground level.

17. The semiconductor memory device as claimed in claim 11, wherein said semiconductor memory device comprises a pseudo-SRAM.

18. A portable electronic device provided with a semiconductor memory device as claimed in claim 11.

* * * * *